US 12,205,948 B2

(12) United States Patent
Yoshida

(10) Patent No.: US 12,205,948 B2
(45) Date of Patent: Jan. 21, 2025

(54) SEMICONDUCTOR DEVICE

(71) Applicant: FUJI ELECTRIC CO., LTD., Kanagawa (JP)

(72) Inventor: Soichi Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 451 days.

(21) Appl. No.: 17/728,946

(22) Filed: Apr. 25, 2022

(65) Prior Publication Data
US 2022/0254775 A1   Aug. 11, 2022

Related U.S. Application Data

(63) Continuation of application No. PCT/JP2021/016926, filed on Apr. 28, 2021.

(30) Foreign Application Priority Data

May 1, 2020   (JP) ................. 2020-081020

(51) Int. Cl.
*H01L 27/07*    (2006.01)
*H01L 29/417*   (2006.01)
(Continued)

(52) U.S. Cl.
CPC .... *H01L 27/0727* (2013.01); *H01L 29/41708* (2013.01); *H01L 29/7397* (2013.01); *H01L 29/861* (2013.01)

(58) Field of Classification Search
CPC ........... H01L 27/0727; H01L 29/41708; H01L 29/7397; H01L 29/861; H01L 29/0696;
(Continued)

(56) References Cited

U.S. PATENT DOCUMENTS 10,056,450 B2    8/2018   Kouno
10,062,753 B2    8/2018   Kouno
(Continued)

FOREIGN PATENT DOCUMENTS

JP    2013152996 A    8/2013
JP    2015118991 A    6/2015
(Continued)

OTHER PUBLICATIONS

International Search Report and (ISA/237) Written Opinion of the International Search Authority for International Patent Application No. PCT/JP2021/016926, issued/mailed by the Japan Patent Office on Aug. 3, 2021.

*Primary Examiner* — Allison Bernstein

(57) ABSTRACT

Provided is a semiconductor device, wherein a straight line extending from an end portion E1 in the extending direction of a contact hole for electrically connecting an emitter electrode and a front surface of a semiconductor substrate toward a back surface of the semiconductor substrate is defined as a first perpendicular line, a straight line forming a predetermined angle θ1 with respect to the first perpendicular line and passing through the end portion E1 in the extending direction of the contact hole is defined as a first straight line, a position where the first straight line intersects a back surface of the semiconductor substrate is defined as a position M1, and the position M1 is located on an outer side of a cathode region in the extending direction.

25 Claims, 12 Drawing Sheets

(51) Int. Cl.
*H01L 29/739* (2006.01)
*H01L 29/861* (2006.01)

(58) Field of Classification Search
CPC . H01L 29/083; H01L 29/407; H01L 29/1608; H01L 29/207; H01L 29/8613; H01L 21/76; H01L 29/167; H01L 29/2003; H01L 29/32; H01L 29/36
See application file for complete search history.

(56) References Cited

U.S. PATENT DOCUMENTS

| | | | |
|---|---|---|---|
| 10,141,304 B2 | 11/2018 | Shinya | |
| 10,170,607 B2 | 1/2019 | Kouno | |
| 10,186,606 B2 * | 1/2019 | Sumitomo | H01L 29/0821 |
| 10,256,234 B2 * | 4/2019 | Tanabe | H01L 27/0664 |
| 10,361,191 B2 | 7/2019 | Takahashi | |
| 11,043,555 B2 | 6/2021 | Yoshida | |
| 11,049,785 B2 | 6/2021 | Kubouchi | |
| 2014/0361333 A1 | 12/2014 | Kimura | |
| 2016/0141400 A1 | 5/2016 | Takahashi | |
| 2017/0162562 A1 | 6/2017 | Haruguchi | |
| 2018/0308838 A1 | 10/2018 | Nakamura | |
| 2019/0259748 A1 | 8/2019 | Tatsuya | |
| 2019/0287962 A1 | 9/2019 | Naito | |

FOREIGN PATENT DOCUMENTS

| | | |
|---|---|---|
| JP | 2015185742 A | 10/2015 |
| JP | 2016096222 A | 5/2016 |
| JP | 2017045949 A | 3/2017 |
| JP | 2017059711 A | 3/2017 |
| JP | 2018186111 A | 11/2018 |
| JP | 2019145613 A | 8/2019 |
| JP | 2019161125 A | 9/2019 |
| JP | 2020077674 A | 5/2020 |
| WO | 2016030966 A1 | 3/2016 |
| WO | 2016098199 A1 | 6/2016 |
| WO | 2018110703 A1 | 6/2018 |

* cited by examiner

SEMICONDUCTOR DEVICE

The contents of the following Japanese patent application (s) are incorporated herein by reference:
No. 2020-081020 filed in JP on May 1, 2020, and
No. PCT/JP2021/016926 filed in WO on Apr. 28, 2021.

BACKGROUND

1. Technical Field

The present invention relates to a semiconductor device.

2. Related Art

A semiconductor device in which a transistor portion such as an insulated gate bipolar transistor (IGBT) and a diode portion are formed on the same substrate is known (see, for example, Patent Document 1 or 2).
Patent Document 1: Japanese Patent Application Publication No. 2015-185742
Patent Document 2: International Publication No. 2018/110703

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention.

As used herein, one side in a direction parallel to a depth direction of a semiconductor substrate is referred to as "upper" and the other side is referred to as "lower". One surface of two main surfaces of a substrate, a layer or other member is referred to as an upper surface, and the other surface is referred to as a lower surface. The "upper" and "lower" directions are not limited to the gravity direction.

In each example, an example in which a first conductivity type is an n type (sometimes referred to as N type) and a second conductivity type is a p type (sometimes referred to as P type) is shown, but the first conductivity type may be the p type and the second conductivity type may be an n type. In this case, the conductivity types of a substrate, a layer, a region, and the like in each example have opposite polarities, respectively.

In the present specification, technical matters may be described using orthogonal coordinate axes of an X axis, a Y axis, and a Z axis. In the present specification, a plane parallel to an upper surface of the semiconductor substrate is defined as an XY plane, and a depth direction perpendicular to the upper surface of the semiconductor substrate is defined as a Z axis. In the present specification, the upper surface of the semiconductor substrate is referred to as a front surface, and the lower surface of the semiconductor substrate is referred to as a back surface.

In the present specification, the doping concentration refers to the concentration of donor or acceptor impurities. In the present specification, a concentration difference between the donor and the acceptor may be referred to as a doping concentration. When the doping concentration distribution in the doped region has a peak, the peak value may be used as the doping concentration in the doped region. When the doping concentration in the doped region is substantially uniform, or the like, the average value of the doping concentration in the doped region may be set as the doping concentration.

Figure 1:
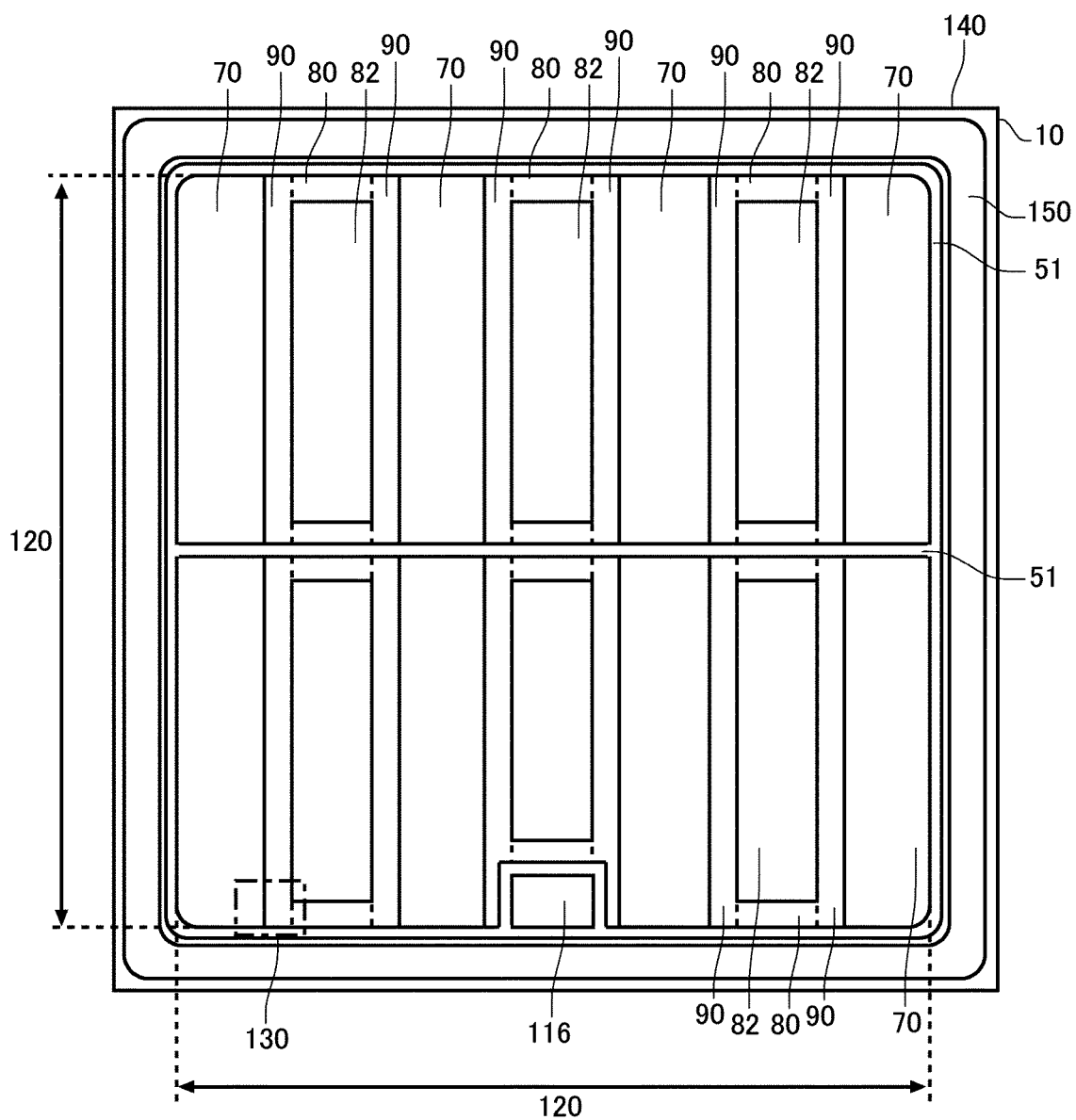
FIG. 1 is a diagram illustrating a structure of a front surface of a semiconductor device 100 according to an embodiment of the present invention.

FIG. 1 is a diagram illustrating a structure of a front surface of a semiconductor device 100 according to an embodiment of the present invention. The semiconductor device 100 includes a semiconductor substrate 10. The semiconductor substrate 10 may be a silicon substrate, a silicon carbide substrate, a nitride semiconductor substrate such as gallium nitride, or the like. The semiconductor substrate 10 of the present example is a silicon substrate. In the present specification, an end portion of the outer periphery of the semiconductor substrate 10 in a top view is referred to as an outer peripheral end 140. The top view indicates a case of being viewed in parallel to the Z axis from the front surface side of the semiconductor substrate 10.

The semiconductor device 100 includes an active portion 120, a gate runner portion 51, and an edge termination structure portion 150. The active portion 120 is a region through which a main current flows between the front surface and the back surface of the semiconductor substrate 10 when the semiconductor device 100 is controlled to be in the ON state. That is, the active region is a region in which a current flows in the depth direction inside the semiconductor substrate 10 from the front surface to the back surface or from the back surface to the front surface of the semiconductor substrate 10.

At least a part of the gate runner portion 51 is provided between the active portion 120 and the outer peripheral end 140 in a plane parallel to the front surface of the semiconductor substrate 10. The gate runner portion 51 is formed of a conductive material such as polysilicon or metal, and supplies a gate voltage to a device provided in the active portion 120. The gate runner portion 51 is formed above or inside the semiconductor substrate 10, and the semiconductor substrate 10 and the gate runner portion 51 are insulated from each other by an dielectric film. The gate runner portion 51 may be disposed to surround the active portion 120 in a plane parallel to the front surface of the semiconductor substrate 10. A part of the gate runner portion 51 may be formed in the active portion 120. A part of the gate runner portion 51 may be provided across the active portion 120 in the X axis direction.

The gate runner portion 51 is electrically connected to a gate pad 116 provided outside the active portion 120. The gate pad 116 may be disposed between the active portion 120 and the outer peripheral end 140. A pad such as an emitter pad electrically connected to the emitter electrode may be provided between the active portion 120 and the outer peripheral end 140.

The active portion 120 is provided with a transistor portion 70 and a diode portion 80. A boundary portion 90 may be provided between the transistor portion 70 and the diode portion 80. In the present specification, the transistor portion 70, the diode portion 80, and the boundary portion 90 may be referred to as a device portion or a device region, respectively. A region where the device portion is provided may be the active portion 120. Note that a region sandwiched between two device portions in a top view of the semiconductor substrate 10 is also referred to as the active portion 120.

In the example of FIG. 1, a region sandwiched between the device portions and provided with the gate runner portion 51 is also included in the active portion 120. The active portion 120 can also be a region sandwiched between a region where the emitter electrode is provided and a region where the emitter electrode is provided in a top view of the semiconductor substrate 10. In the example of FIG. 1, the emitter electrode is provided above the transistor portion 70, the diode portion 80, and the boundary portion 90.

The transistor portion 70 includes a transistor such as an IGBT. The diode portion 80 is alternately disposed with the transistor portion 70 in a predetermined first direction in the front surface of the semiconductor substrate 10. The first direction is the X axis direction in FIG. 1. In the present specification, the first direction may be referred to as an arrangement direction.

In each diode portion 80, an N+ type cathode region 82 is provided in a region in contact with the back surface of the semiconductor substrate 10. The diode portion 80 is a region in which the cathode region 82 is provided in the back surface of the semiconductor substrate 10. In the semiconductor device 100 of the present example, a region other than the cathode region 82 in the region in contact with the back surface of the semiconductor substrate 10 is a P+ type collector region.

The diode portion 80 is a region obtained by projecting the cathode region 82 in the Z axis direction. However, as indicated by a broken line in FIG. 1, region obtained by extending, to the end portion of the active portion 120 (for example, a position in contact with the gate runner portion 51) in the Y axis direction, the region obtained by projecting the cathode region 82 in the Z axis direction is also referred to as the diode portion 80.

The transistor portion 70 is a region in which a collector region is formed on the back surface of the semiconductor substrate 10 and a unit structure including an N+ type emitter region is periodically formed on the front surface of the semiconductor substrate 10. The boundary portion 90 is a region other than the transistor portion 70 in the region where the collector region is formed on the back surface of the semiconductor substrate 10.

In the active portion 120, the transistor portion 70 may be provided at both ends in the X axis direction. The active portion 120 may be divided in the Y axis direction by the gate runner portion 51. In each divided region of the active portion 120, the transistor portion 70 and the diode portion 80 are alternately disposed in the X axis direction.

The edge termination structure portion 150 is provided between the active portion 120 and the outer peripheral end 140 of the semiconductor substrate 10 in the front surface of the semiconductor substrate 10. The edge termination structure portion 150 of the present example is provided between the gate runner portion 51 and the outer peripheral end 140. The edge termination structure portion 150 may be annularly disposed so as to surround the active portion 120 in the front surface of the semiconductor substrate 10. The edge termination structure portion 150 of the present example is disposed along the outer peripheral end 140 of the semiconductor substrate 10. The edge termination structure portion 150 reduces the electric field strength in the front surface side of the semiconductor substrate 10. The edge termination structure portion 150 has, for example, a guard ring, a field plate, a RESURF, and a combination thereof.

Figure 2A:
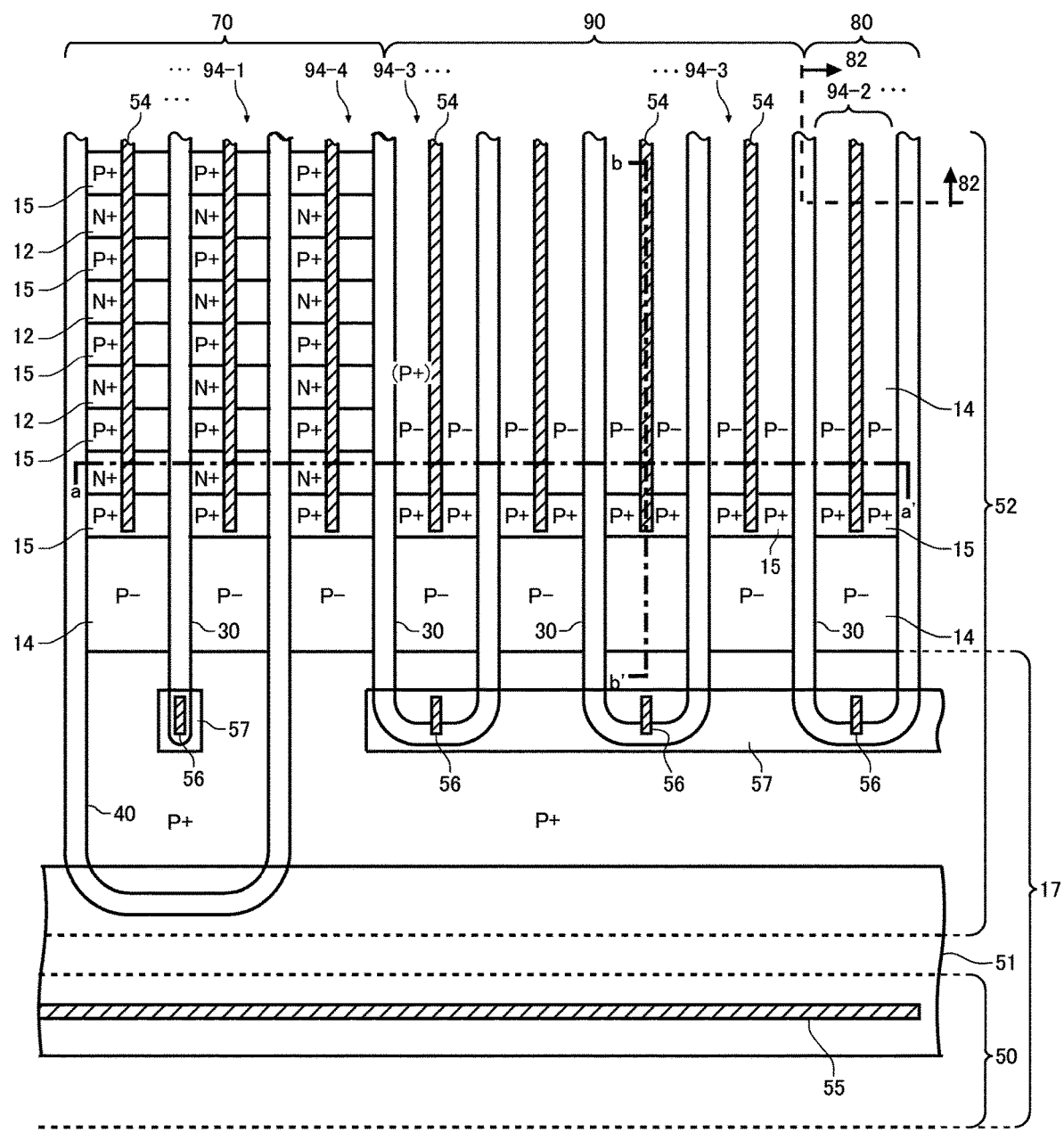
FIG. 2A is a top view illustrating an example of a region 130 of the semiconductor device 100 illustrated in FIG. 1.

FIG. 2A is a top view illustrating an example of a region 130 of semiconductor device 100 illustrated in FIG. 1. The semiconductor device 100 of the present example is a semiconductor chip provided in the semiconductor substrate 10 and including the transistor portion 70 including a transistor such as an IGBT and the diode portion 80 including a diode such as a free wheel diode (FWD).

In the front surface of the semiconductor substrate 10, the boundary portion 90 is provided between the transistor portion 70 and the diode portion 80. The front surface of the semiconductor substrate 10 refers to one of two opposing main surfaces of the semiconductor substrate 10. In FIG. 2A, the chip upper surface around the chip end portion is illustrated, and illustration of the other regions are omitted.

In addition, the active region of the semiconductor substrate 10 in the semiconductor device 100 is illustrated in FIG. 2A, but as illustrated in FIG. 1, the semiconductor device 100 may include an edge termination structure portion 150 surrounding the active region.

The semiconductor device 100 of the present example includes a gate trench portion 40, a dummy trench portion 30, a well region 17, an emitter region 12, a base region 14, and a contact region 15 formed inside the front surface side of the semiconductor substrate 10. In addition, the semiconductor device 100 of the present example includes an emitter electrode 52 and a gate metal layer 50 provided above the front surface of the semiconductor substrate 10. The emitter electrode 52 and the gate metal layer 50 are provided separately from each other.

An interlayer dielectric film is formed between the emitter electrode 52 and the gate metal layer 50 and a front surface 21 of the semiconductor substrate 10, but illustration thereof is omitted in FIG. 2A. In the interlayer dielectric film of the present example, a contact hole 54, a contact hole 55, and a contact hole 56 are formed through the interlayer dielectric film.

The emitter electrode 52 is electrically connected to the emitter region 12, the contact region 15, and the base region 14 in the front surface 21 of the semiconductor substrate 10 through the contact hole 54 which is opened in the interlayer dielectric film. The emitter electrode 52 is connected to a dummy conductive portion in the dummy trench portion 30 through the contact hole 56. A connection portion 57 formed of a material having conductivity such as polysilicon doped with impurities may be provided between the emitter electrode 52 and the dummy conductive portion. The connection portion 57 is formed in the front surface of the semiconductor substrate 10.

The gate metal layer 50 is in contact with the gate runner portion 51 through the contact hole 55. The gate runner portion 51 is formed of a semiconductor such as polysilicon doped with impurities. The gate runner portion 51 is connected to the gate conductive portion in the gate trench portion 40 in the front surface of the semiconductor substrate 10. That is, the gate runner portion 51 is formed between a part of the gate trench portion 40 and the contact hole 55 in the front surface of the semiconductor substrate 10.

The emitter electrode 52 and the gate metal layer 50 are formed of a material containing metal. For example, at least a partial region of each electrode is formed of aluminum or an aluminum silicon alloy. Each electrode may have a barrier metal formed of titanium, a titanium compound, or the like in a lower layer of a region formed of aluminum or the like, and may have a plug formed of tungsten or the like in the contact hole.

In the transistor portion 70, one or more gate trench portions 40 are arranged at predetermined intervals along the arrangement direction of the each trench. The gate conductive portion inside the gate trench portion 40 is electrically connected to the gate metal layer 50, and a gate potential is applied thereto. In the transistor portion 70, one or more dummy trench portions 30 may be arranged at predetermined intervals along the arrangement direction. A potential different from the gate potential is applied to the dummy conductive portion inside the dummy trench portion 30. The dummy conductive portion of the present example is electrically connected to the emitter electrode 52, and an emitter potential is applied thereto.

In the transistor portion 70, one or more gate trench portions 40 and one or more dummy trench portions 30 may be alternately formed along the arrangement direction. The dummy trench portions 30 are arranged at predetermined intervals along the arrangement direction in the diode portion 80 and the boundary portion 90. Note that the transistor portion 70 may be configured only by the gate trench portion 40 without being provided with the dummy trench portion 30.

The gate trench portion 40 and the dummy trench portion 30 are formed to extend in a predetermined extending direction in the front surface of the semiconductor substrate 10. A part of the dummy trench portion 30 in the transistor portion 70 of the present example has a linear shape and is formed to extend in an extending direction perpendicular to the above-described arrangement direction. The dummy trench portion 30 may have a U shape in which the edges of two linear portions are connected. In the example of FIG. 2A, the dummy trench portion 30 of the transistor portion 70 has a linear shape, and the dummy trench portion 30 in the diode portion 80 and the boundary portion 90 has a U shape. However, the shape of the dummy trench portion 30 is not limited to the example of FIG. 2A. At least a part of the dummy trench portion 30 of the transistor portion 70 may have a U shape, and at least a part of the dummy trench portion 30 in the diode portion 80 and the boundary portion 90 may have a linear shape.

In FIG. 2A, the X axis direction is set as an arrangement direction of trench portions. In addition, the Y axis direction is set as an extending direction of the trench portion. The X axis and the Y axis are axes orthogonal to each other in a plane parallel to the front surface of the semiconductor substrate 10. An axis orthogonal to the X axis and the Y axis is set as a Z axis. In the present specification, the Z axis direction may be referred to as the depth direction.

The gate trench portion 40 in the example of FIG. 2A has a linear portion and a connection portion connecting the two linear portions. The linear portion is formed to extend in the above-described extending direction. The linear portions of the respective trench portions are formed in parallel. The connection portion may have a curved shape in the front surface of the semiconductor substrate 10.

In the connection portion at the edge of the gate trench portion 40, the gate conductive portion in the gate trench portion 40 and the gate runner portion 51 are connected. The gate trench portion 40 may be provided so as to protrude toward the gate runner portion 51 from the dummy trench portion 30 in the extending direction (Y axis direction). The protruding portion of the gate trench portion 40 is connected to the gate runner portion 51.

The emitter electrode 52 is formed above the gate trench portion 40, the dummy trench portion 30, the well region 17, the emitter region 12, the base region 14, and the contact region 15. The well region 17 is formed in a predetermined range from the end portion of the active region on the side where the gate metal layer 50 is provided. In the present example, the end portion of the well region 17 in the Y axis direction is connected to the end portion of the base region 14. The diffusion depth of the well region 17 may be deeper than the depths of the gate trench portion 40 and the dummy trench portion 30. Some region of the gate trench portion 40 and the dummy trench portion 30 on the gate metal layer 50 side is formed in the well region 17. The bottom of the end of the dummy trench portion 30 in the extending direction may be covered with the well region 17.

The semiconductor substrate 10 has a first conductivity type, and the well region 17 has a second conductivity type different from that of the semiconductor substrate 10. The semiconductor substrate 10 of the present example is of an N− type, and the well region 17 is of a P+ type. The base region 14 is formed in a mesa portion which is a region sandwiched between each trench portion. The base region 14 is of the second conductivity type having a doping concentration lower than that of the well region 17. The base region 14 in the present example is of a P− type. The symbols + and − in the conductivity type indicate that the doping concentration is relatively high in the case of + and the doping concentration is relatively low in the case of −.

The contact region 15 of the second conductivity type having a doping concentration higher than that of the base region 14 may be selectively formed in the upper surface of the base region 14 in each mesa portion. The contact region 15 of the present example is of a P+ type. In addition, in the transistor portion 70, the emitter region 12 of the first conductivity type having a doping concentration higher than that of the semiconductor substrate 10 is selectively formed in the upper surface of the base region 14. The emitter region 12 in the present example is of an N+ type. In the present example, the emitter region 12 is not formed in the mesa portion of the diode portion 80 and the boundary portion 90.

Each of the contact region 15 and the emitter region 12 is formed from one of adjacent trench portions to the other trench portion. The one or more contact regions 15 and the one or more emitter regions 12 of the transistor portion 70 are formed so as to be alternately exposed at the upper surface of the mesa portion along the extending direction of the trench portion.

In the mesa portion of the diode portion 80 and the boundary portion 90, the contact region 15 is formed in a region facing at least one contact region 15 in the transistor portion 70. In the example of FIG. 2A, in the mesa portion of the diode portion 80 and the boundary portion 90, the contact region 15 is formed in a region facing the contact region 15 closest to the gate metal layer 50 side in the transistor portion 70, and the base region 14 is formed in the other region.

The contact hole 54 is formed above each of the emitter region 12 and the contact region 15 in the transistor portion 70. The contact hole 54 is not formed in a region corresponding to the base region 14 and the well region 17.

In the diode portion 80 and the boundary portion 90, the contact hole 54 is formed above the contact region 15 and the base region 14. In the present example, the contact holes 54 of the transistor portion 70, the diode portion 80, and the boundary portion 90 have the same length in the extending direction of each trench portion.

Note that the trench portion may not be formed in the diode portion 80. The extending direction in this case may be the extending direction of the trench portion of the transistor portion 70, and the direction perpendicular to the side of the semiconductor device closest to the contact hole end of the diode portion 80 may be the extending direction.

The boundary portion 90 indicates a region in which the emitter region 12 of the first conductivity type is not provided in the mesa portion on the front surface side of the semiconductor substrate 10, and in which the collector region is provided on the back surface side of the semiconductor substrate 10. Note that FIG. 2A illustrates a position of the cathode region 82 provided on the back surface side of the semiconductor substrate 10 when projected onto the front surface side. The dummy trench portion 30 is provided in the boundary portion 90.

A mesa portion 94-1, a mesa portion 94-2, and a mesa portion 94-3 are mesa portions provided in the transistor portion 70, the diode portion 80, and the boundary portion 90, respectively. The boundary mesa portion 94-3 is provided with the base region 14 and the contact region 15 in the same arrangement as the mesa portion 94-2 of the diode portion 80. In the mesa portion 94-2 and the mesa portion 94-3, the area of the front surface 21 of the base region 14 is larger than the area of the contact region 15. However, a collector region 22 is provided on the back surface of the semiconductor substrate 10 in the boundary mesa portion 94-3. Among the plurality of boundary mesa portions 94-3, the front surface 21 of one boundary mesa portion 94-3 disposed closest to the transistor portion 70 side may be covered with the contact region 15 instead of the base region 14. The same applies to other (implementation) examples.

A mesa portion 94-4 is a mesa portion disposed closest to the diode portion 80 side in the transistor portion 70. The mesa portion 94-4 is provided with the emitter region 12 and the contact region 15 in the same arrangement as the transistor portion 70.

Note that the doping concentration of the base region 14 of the boundary portion 90 or the diode portion 80 may be smaller than that of the base region 14 of the transistor portion 70. The peak value of the doping concentration of the base region 14 of the boundary portion 90 or the diode portion 80 may be 0.1 times or less the peak value of the doping concentration of the base region 14 of the transistor portion 70. In addition, the integral value of the doping concentration along the depth direction from the front surface 21 may be smaller in the base region 14 of the boundary portion 90 or the diode portion 80 than in the base region 14 of the transistor portion 70. The integral value of the doping concentration along the depth direction in the base region 14 of the boundary portion 90 or the diode portion 80 may be 0.1 times or less the integral value of the doping concentration in the depth direction in the base region 14 of the transistor portion 70. As a result, a reverse recovery current can be reduced.

Figure 2B:
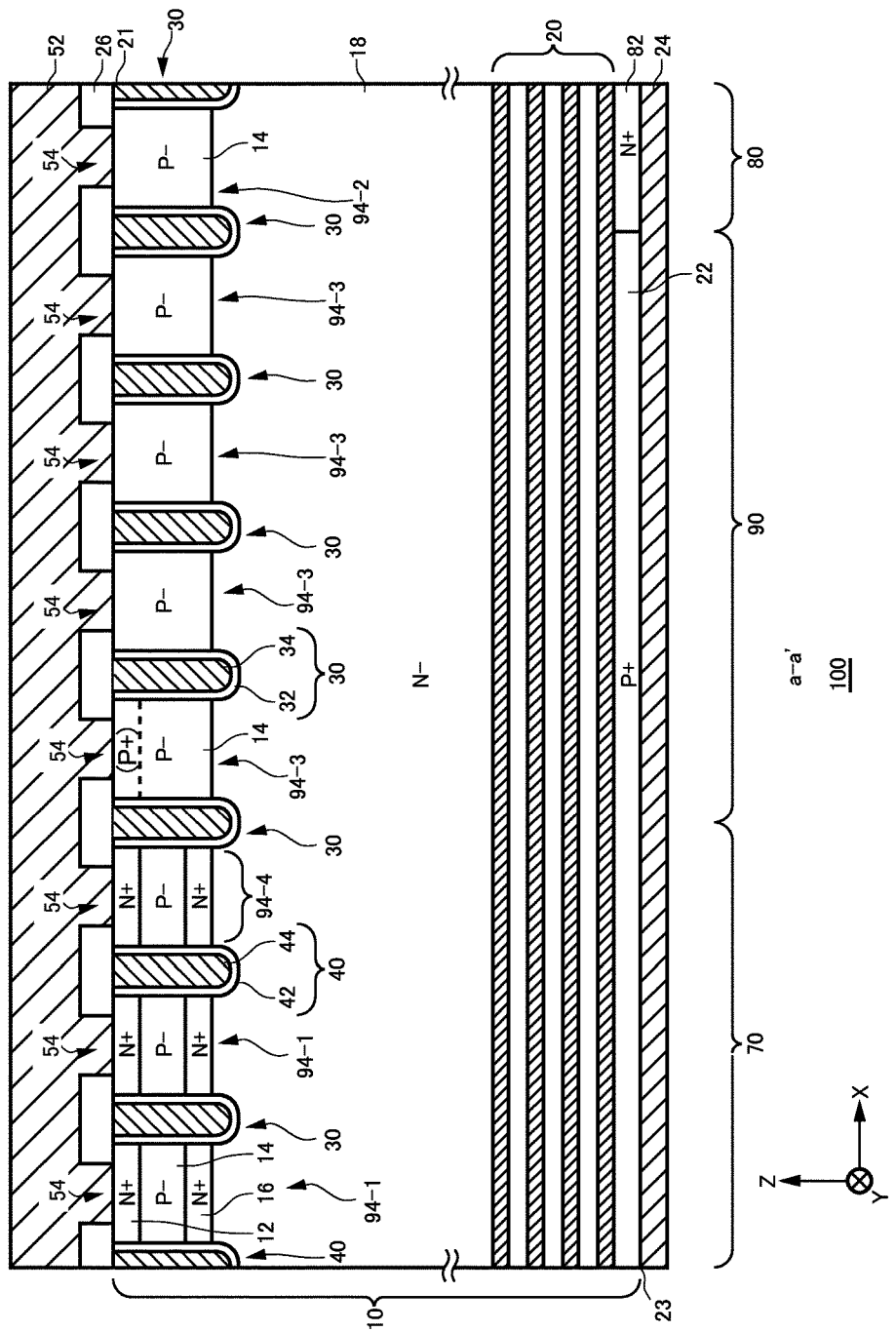
FIG. 2B is a diagram illustrating an example of a cross section a-a' of the semiconductor device 100 illustrated in FIG. 2A.

FIG. 2B is a diagram illustrating an example of a cross section a-a' of the semiconductor device 100 illustrated in FIG. 2A. The cross section a-a' is a cross section parallel to the X-Z plane and passing through the emitter region 12 of the transistor portion 70.

The semiconductor device 100 of the present example includes the semiconductor substrate 10, an interlayer dielectric film 26, the emitter electrode 52, and a collector electrode 24 in the cross section. The emitter electrode 52 is formed on the upper surface of the semiconductor substrate 10 and the interlayer dielectric film 26.

The collector electrode 24 is formed in a back surface 23 of the semiconductor substrate 10. The back surface refers to a surface opposite to the front surface. The emitter electrode 52 and the collector electrode 24 are formed of a conductive material such as metal. In the present specification, a surface or an end portion on the emitter electrode 52 side of each member such as a substrate, a layer, or a region is referred to as an upper surface or an upper end, and a surface or an end portion on the collector electrode 24 side is referred to as a lower surface or a lower end. A direction connecting the emitter electrode 52 and the collector electrode 24 is set as the Z axis direction (depth direction).

The semiconductor substrate 10 may be a silicon substrate, a silicon carbide substrate, a nitride semiconductor substrate such as gallium nitride, or the like. A P− type base region 14 is formed in the front surface 21 side of the semiconductor substrate 10.

In the cross section, in the upper surface side of each mesa portion 94 of the transistor portion 70, an N+ type emitter region 12 and a P− type base region 14 are formed in order from the front surface 21 side of the semiconductor substrate 10. An N+ type accumulation region 16 may be further formed under the base region 14.

In the cross section, the P− type base region 14 is formed on the upper surface side of each mesa portion 94 of the diode portion 80 and the boundary portion 90. The emitter region 12 may not be formed in each mesa portion 94 of the diode portion 80 and the boundary portion 90. The accumulation region 16 may not be formed in each mesa portion 94 of the diode portion 80 and the boundary portion 90.

In the transistor portion 70, an N− type drift region 18 is formed in the lower surface of the accumulation region 16. By providing the accumulation region 16 having a concentration higher than that of the drift region 18 between the drift region 18 and the base region 14, the carrier injection enhancement effect (IE effect) can be increased, and the on-voltage can be reduced.

In the diode portion 80 and the boundary portion 90, a drift region 18 is formed in the lower surface of the base region 14. In both the transistor portion 70 and the diode portion 80, an N− type buffer region 20 is formed in the lower surface of the drift region 18.

The buffer region 20 is formed on the lower surface side of the drift region 18. The doping concentration of the buffer region 20 is higher than the doping concentration of the drift region 18. The buffer region 20 may function as a field stop layer that prevents a depletion layer spreading from the lower surface side of the base region 14 from reaching the P+ type collector region 22 and the N+ type cathode region 82.

The buffer region 20 may have a plurality of peaks in the doping concentration distribution in the depth direction. For example, the doping concentration distribution in the buffer region 20 has four peaks. The peak of the doping concentration in the buffer region 20 may be a concentration peak of a hydrogen donor formed by proton implantation and heat treatment.

In the transistor portion 70 and the boundary portion 90, a P+ type collector region 22 is formed in the lower surface of the buffer region 20. In the diode portion 80, an N+ type cathode region 82 is formed in the lower surface of the buffer region 20.

One or more gate trench portions 40 and one or more dummy trench portions 30 are formed on the front surface 21 side of the semiconductor substrate 10. Each trench portion penetrates the base region 14 from the front surface 21 of the semiconductor substrate 10 and reaches the drift region 18. That is, the gate trench portion 40 and the dummy trench portion 30 of the present example are provided from the front surface 21 to a position deeper than the emitter region 12. In the region where at least one of the emitter region 12, the contact region 15, and the accumulation region 16 is provided, each trench portion also penetrates these regions and reaches the drift region 18.

The gate trench portion 40 includes a gate trench formed on the front surface 21 side of the semiconductor substrate 10, a gate dielectric film 42, and a gate conductive portion 44. The gate dielectric film 42 is formed to cover the inner wall of the gate trench. The gate dielectric film 42 may be formed by oxidizing or nitriding the semiconductor in the inner wall of the gate trench. The gate conductive portion 44 is formed on the inner side with respect to the gate dielectric film 42 inside the gate trench. That is, the gate dielectric film 42 insulates the gate conductive portion 44 from the semiconductor substrate 10. The gate conductive portion 44 is formed of a conductive material such as polysilicon doped with impurities.

The gate conductive portion 44 includes at least a region facing the adjacent base region 14 in the Z axis direction. The gate trench portion 40 is covered with the interlayer dielectric film 26 in the front surface 21 of the semiconductor substrate 10. In the present example, the gate conductive portion 44 is electrically connected to the gate metal layer 50 via the gate runner portion 51 at the edge of the gate trench portion 40 illustrated in FIG. 2A. When a predetermined voltage is applied to the gate conductive portion 44, a channel is formed in the surface layer of the interface in contact with the gate trench portion 40 in the base region 14.

The dummy trench portion 30 may have the same structure as the gate trench portion 40 in the cross section. The dummy trench portion 30 includes a dummy trench formed in the front surface 21 side of the semiconductor substrate 10, a dummy dielectric film 32, and a dummy conductive portion 34. The dummy dielectric film 32 is formed to cover the inner wall of the dummy trench. The dummy conductive portion 34 is formed inside the dummy trench and is formed on the inner side with respect to the dummy dielectric film 32. The dummy dielectric film 32 insulates the dummy conductive portion 34 from the semiconductor substrate 10. The dummy conductive portion 34 may be formed of the same material as the gate conductive portion 44. The dummy trench portion 30 may have the same length as the gate trench portion 40 in the depth direction.

The dummy trench portion 30 is covered with the interlayer dielectric film 26 in the front surface 21 of the semiconductor substrate 10. In the present example, the dummy conductive portion 34 is electrically connected to the emitter electrode 52 via the contact hole 56 and the connection portion 57 as illustrated in FIG. 2A.

Figure 2C:
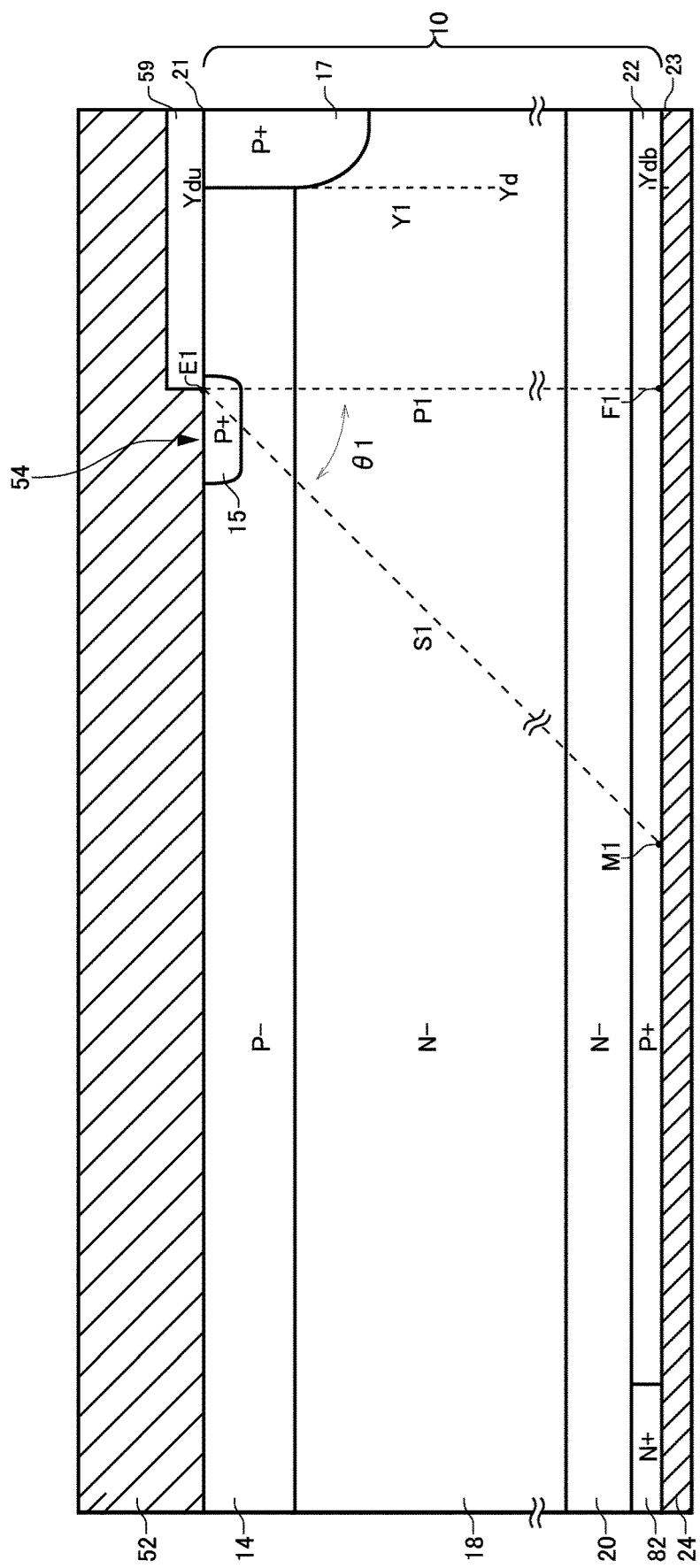
FIG. 2C is a diagram illustrating an example of a cross section b-b' of the semiconductor device 100 illustrated in FIG. 2A.

FIG. 2C is a diagram illustrating an example of a cross section b-b' of the semiconductor device 100 illustrated in FIG. 2A. The cross section b-b' is a cross section parallel to the Y-Z plane and passing through the contact hole 54 of the boundary portion 90. FIG. 2C illustrates a cross section including the diode portion 80.

In the cross section b-b', the base region 14, the contact region 15, and the well region 17 are provided in the front surface 21 side of the semiconductor substrate 10. The contact region 15 is selectively formed in the base region 14. The well region 17 is formed to be deeper than the base region 14 outside the base region 14 in the extending direction of the trench portion.

The end portion E1 is an end portion of the contact hole 54 in the extending direction for electrically connecting the emitter electrode 52 and the front surface 21 of the semiconductor substrate 10. The end portion E1 may be an end portion of a dielectric film 59 in the extending direction. The dielectric film 59 is provided between the emitter electrode 52 and the semiconductor substrate 10. The position of the end portion E1 in the depth direction corresponds to the front surface 21. The end portion E1 is provided on the inner side of the diode portion 80 (that is, the positive side in the Y axis direction) with respect to a position Yd of the end portion of the well region 17 in the extending direction in a top view. A position where a perpendicular line Y1 extending from the position Yd of the end portion toward the front surface 21 intersects the front surface 21 is defined as a position Ydu, and a position where the perpendicular line Y1 extending from the position Yd of the end portion toward the back surface 23 intersects the back surface 23 is defined as a position Ydb. The position Ydu is provided on the outer side of the diode portion 80 with respect to the end portion E1.

A first straight line S1 is a straight line that forms a predetermined angle θ1 with a first perpendicular line P1 extending from the end portion E1 toward the back surface 23 of the semiconductor substrate 10 and passes through the end portion E1. The angle θ1 may be 20° or more, and may be 30° or more. The angle θ1 may be 80° or less, or 60° or less. The angle θ1 may be 45°. The first perpendicular line P1 is a straight line passing through the end portion E1 and extending in the Z axis direction. An intersection of the first perpendicular line P1 and the back surface 23 is defined as F1.

A position M1 is a position where the first straight line S1 intersects the back surface 23 of the semiconductor substrate 10 in the extending direction. The position M1 is located on the outer side of the cathode region 82 in the extending direction. The cathode region 82 of the present example is provided on the inner side of the diode portion 80 (that is, the positive side in the Y axis direction) with respect to the position M1. The distance between a position F1 and the position Ydb may be shorter than the distance between the position F1 and the position M1. In this way, by disposing the cathode region 82 on the inner side of the diode portion 80 with respect to the end portion E1 of the contact hole 54 in the extending direction, the peak current at the time of the reverse recovery of the diode portion 80 can be suppressed, and the withstand capability of the semiconductor device 100 can be improved.

For example, when the angle θ1 is 45°, the cathode region 82 is provided on the inner side of the diode portion 80 with respect to the thickness $W_0$ of the semiconductor substrate 10 in the Z axis direction with respect to the end portion E1 in a plane parallel to the front surface 21. In an example, the thickness $W_0$ of the semiconductor substrate 10 in the Z axis direction is 50 μm or more and 650 μm or less. Note that, in the present example, the structure on the negative side in the Y axis direction has been described, but the same structure may be provided on the positive side in the Y axis direction, which is the opposite side of the semiconductor substrate 10.

Figure 3A:
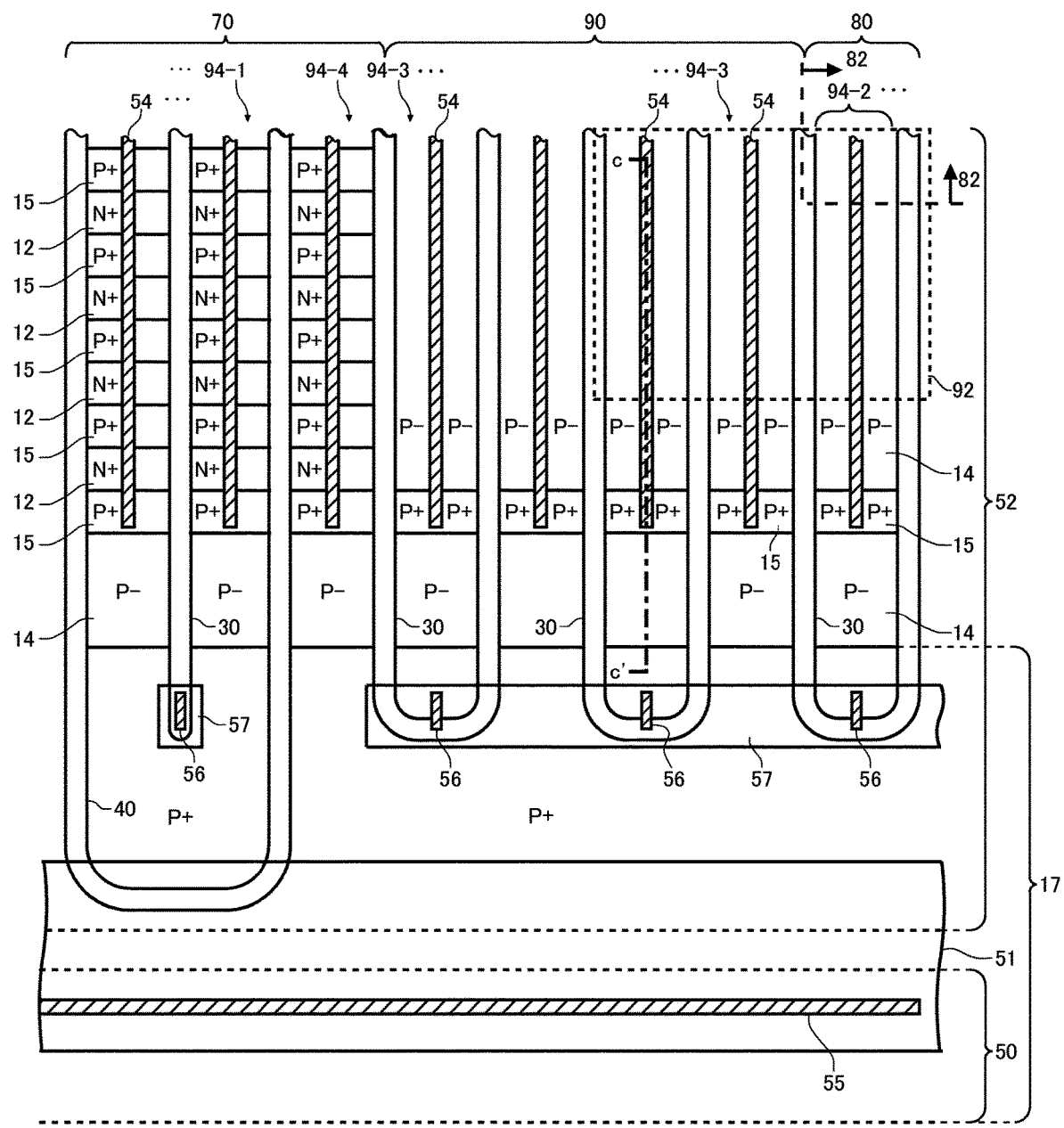
FIG. 3A is a top view illustrating an example of the region 130 of the semiconductor device 100 illustrated in FIG. 1.

FIG. 3A is a top view illustrating an example of the region 130 of semiconductor device 100 illustrated in FIG. 1. The semiconductor device 100 of the present example is different from the example of FIG. 2A in that a front surface side lifetime reduction region 92 is included.

The front surface side lifetime reduction region 92 is provided in the diode portion 80 and a partial region of the boundary portion 90. The front surface side lifetime reduction region 92 is provided on the front surface 21 side of the semiconductor substrate 10. The front surface side lifetime reduction region 92 is selectively formed at a predetermined depth position between the center of the semiconductor substrate 10 in the depth direction and the front surface 21 of the semiconductor substrate 10.

The front surface side lifetime reduction region 92 is a region in which a lifetime killer is intentionally introduced by, for example, implanting impurities into the semiconductor substrate 10. The value of the lifetime of the carrier of electrons or holes in the region in which the lifetime killer is intentionally introduced is smaller than that of the lifetime of the carrier in the region in which the lifetime killer is not intentionally introduced. The lifetime killer is a recombination center of the carrier, may be a crystal defect, may be a dangling bond formed by vacancies, double vacancies or the like, vacancies or the like, or may be a defect complex of these and an element constituting the semiconductor substrate 10, a dislocation, a rare gas element such as helium or neon, a metal element such as platinum, or the like. As an example, the front surface side lifetime reduction region 92 is formed by irradiating the depth position with ions such as helium.

The region where the front surface side lifetime reduction region 92 is provided in the boundary portion 90 is adjacent to the diode portion 80. On the other hand, the transistor portion 70 is not provided with the front surface side lifetime reduction region 92.

By providing the front surface side lifetime reduction region 92 in the diode portion 80, it is possible to adjust the carrier lifetime in the diode portion 80 and reduce the loss at the time of the reverse recovery. Since the boundary portion 90 is provided and the front surface side lifetime reduction region 92 is provided also in the boundary portion 90, the lifetime of the hole flowing into the diode portion 80 from the transistor portion 70 can be controlled without providing the front surface side lifetime reduction region 92 in the transistor portion 70.

Since the front surface side lifetime reduction region 92 is not provided in the transistor portion 70, even if ions such as helium are irradiated from the front surface 21 side of the semiconductor substrate 10, the gate dielectric film and the like in the transistor portion 70 are not damaged. Therefore, fluctuation of the threshold voltage or the like in the transistor portion 70 can be suppressed. Since ions such as helium can be irradiated from the front surface 21 side of the semiconductor substrate 10, the irradiation position of the ions can be made shallow, and the depth position of the front surface side lifetime reduction region 92 can be accurately controlled.

As compared with the case of irradiating ions such as helium from the back surface 23 side of the semiconductor substrate 10, the acceleration energy for irradiating ions such as helium can be reduced, so that the cost of the mask or the like can be reduced. The acceleration energy for irradiating ions such as helium may be a value at which the ions to be irradiated do not pass through (do not penetrate) the semiconductor substrate 10.

The cathode region 82 is formed in a partial region of the mesa portion 94-2 in the extending direction. For example, the cathode region 82 is formed inside the outermost (the gate runner portion 51 side) contact region 15.

Figure 3B:
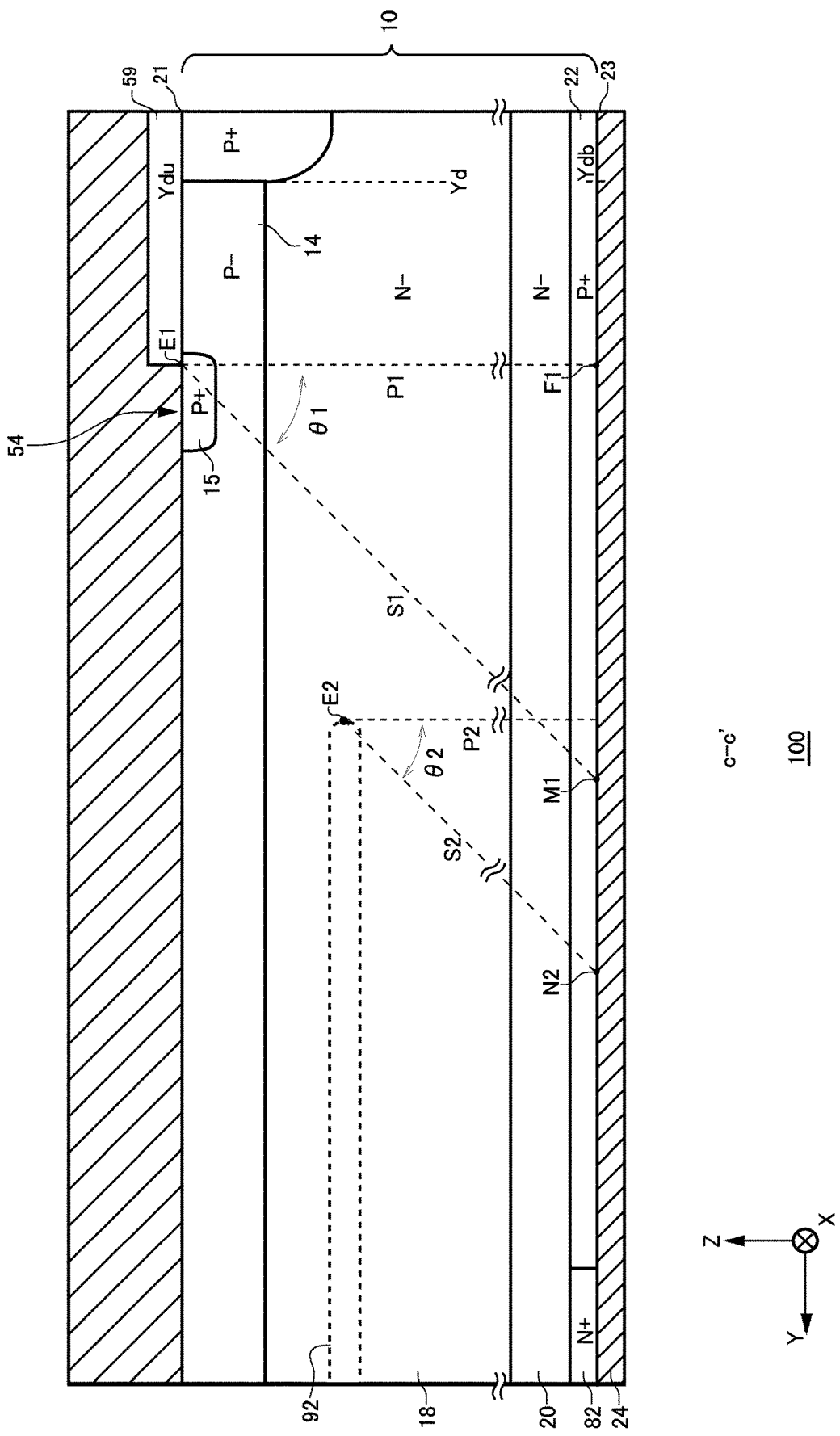
FIG. 3B is a diagram illustrating an example of a cross section c-c' of the semiconductor device 100 illustrated in FIG. 3A.

FIG. 3B is a diagram illustrating an example of a cross section c-c' of the semiconductor device 100 illustrated in FIG. 3A. The cross section c-c' is a cross section parallel to the Y-Z plane and passing through the contact hole 54 of the boundary portion 90. The semiconductor device 100 of the present example is different from the example of FIG. 2C in that the front surface side lifetime reduction region 92 is included.

The front surface side lifetime reduction region 92 is formed below the base region 14. The front surface side lifetime reduction region 92 may be formed below the lower end of the well region 17, and may be formed above the lower end of the well region 17. The front surface side lifetime reduction region 92 of the present example is formed such that the peak position in the depth direction is lower than the lower end of the well region 17.

An end portion E2 is an end portion of the front surface side lifetime reduction region 92 in the extending direction. The position of the end portion E2 in the depth direction may be a peak position of the front surface side lifetime reduction region 92 in the depth direction of the semiconductor substrate 10. The end portion E2 is located closer to the cathode region 82 side with respect to the end portion E1 of the contact hole 54 in the extending direction. The end portion E2 is provided on the inner side of the diode portion 80 with respect to the end position Yd of the well region 17 in the extending direction. The end portion E2 is located on the outer side of the cathode region 82, and the front surface side lifetime reduction region 92 is provided extending to the outer side of the diode portion 80 (that is, the negative side in the Y axis direction) with respect to the cathode region 82.

The end portion E2 may be provided on the inner side of the diode portion 80 with respect to the first straight line S1 in the extending direction. The end portion E2 of the present example is provided between the position M1 and the end portion E1 in the extending direction. That is, the front surface side lifetime reduction region 92 extends to the outer side (that is, the negative side in the Y axis direction) of the diode portion 80 with respect to the position M1. When the angle θ1 is 45°, the distance between the end portion E1 and the end portion E2 in the extending direction is smaller than the thickness of the semiconductor substrate 10 in the Z axis direction.

However, the end portion E2 may be provided between the position M1 and the cathode region 82 in the extending direction. In this case, the front surface side lifetime reduction region 92 does not extend to the position M1 and terminates on the inner side of the diode portion 80 (that is, the positive side in the Y axis direction) with respect to the position M1. The front surface side lifetime reduction region 92 is not provided on the outer side of the chip of the semiconductor device 100 from the end portion E2. Note that the relationship among the end portion E1, the first perpendicular line P1, the first straight line S1, and the position M1 is the same as that in FIG. 2C.

The second straight line S2 is a straight line that forms a predetermined angle θ2 with a second perpendicular line P2 from the end portion E2 toward the back surface 23 of the semiconductor substrate 10 and passes through the end portion E2. The angle θ2 may be 20° or more, and may be 30° or more. The angle θ2 may be 80° or less, or 60° or less. The angle θ2 may be 45°. The angle θ2 may be the same as or different from the angle θ1. The second perpendicular line P2 is a straight line passing through the end portion E2 and extending in the Z axis direction.

A position N2 is a position where the second straight line S2 intersects the back surface 23 of the semiconductor substrate 10 in the extending direction (that is, the Y axis direction). The position N2 is located on the outer side of the cathode region 82 in the extending direction. In this way, the cathode region 82 of the present example is located on the further inner side of the diode portion 80 with respect to the end portion E2 of the front surface side lifetime reduction region 92. As a result, the peak current at the time of the reverse recovery of the diode portion 80 can be suppressed, and the withstand capability of the semiconductor device 100 can be improved. The front surface side lifetime reduction region 92 of the present example is provided in a range wider than the cathode region 82 in the extending direction. As a result, the lifetime of the holes injected from the outer side of the cathode region 82 can be appropriately controlled.

Figure 4A:
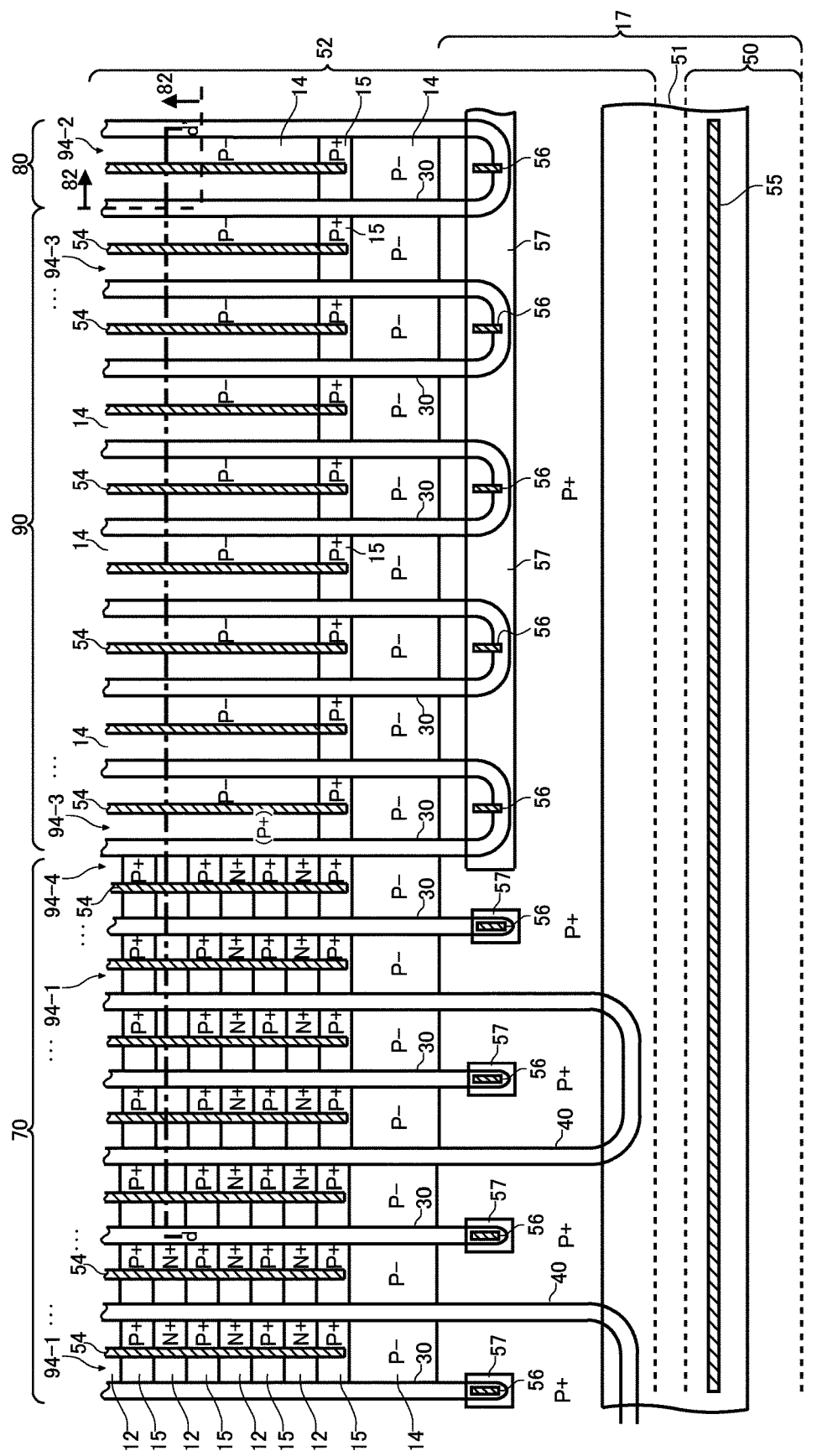
FIG. 4A is a top view illustrating an example of the region 130 of the semiconductor device 100 illustrated in FIG. 1.

FIG. 4A is a top view illustrating an example of the region 130 of semiconductor device 100 illustrated in FIG. 1. In the present example, the arrangement of the boundary portion 90 is different from the case of FIG. 2A. The semiconductor device 100 of the present example does not include the front surface side lifetime reduction region 92.

The mesa portion 94-4 is the mesa portion 94 including the emitter region 12 in the transistor portion 70 and being closest to the boundary portion 90. The mesa portion 94-4 is provided with the emitter region 12 and the contact region 15 in the same arrangement as the transistor portion 70. The mesa portion 94-4 is sandwiched between the dummy trench portions 30. Therefore, in the mesa portion 94-4, a channel is not formed when the transistor portion 70 is turned on.

When the diode portion 80 is in the on state, electrons injected from the cathode region 82 flow not only to the base region 14 of the diode portion 80 but also to the boundary portion 90 and the base region 14 of the transistor portion 70 according to the electrostatic potential distribution. At this time, when the gate is in the on state, electrons flow out to the emitter region 12 through the channel, and holes are less likely to be injected from the base region 14 of the diode portion 80. By sandwiching the mesa portion 94-4 by the dummy trench portion 30, it is possible to prevent electrons from flowing to the emitter region 12 through the channel.

Figure 4B:
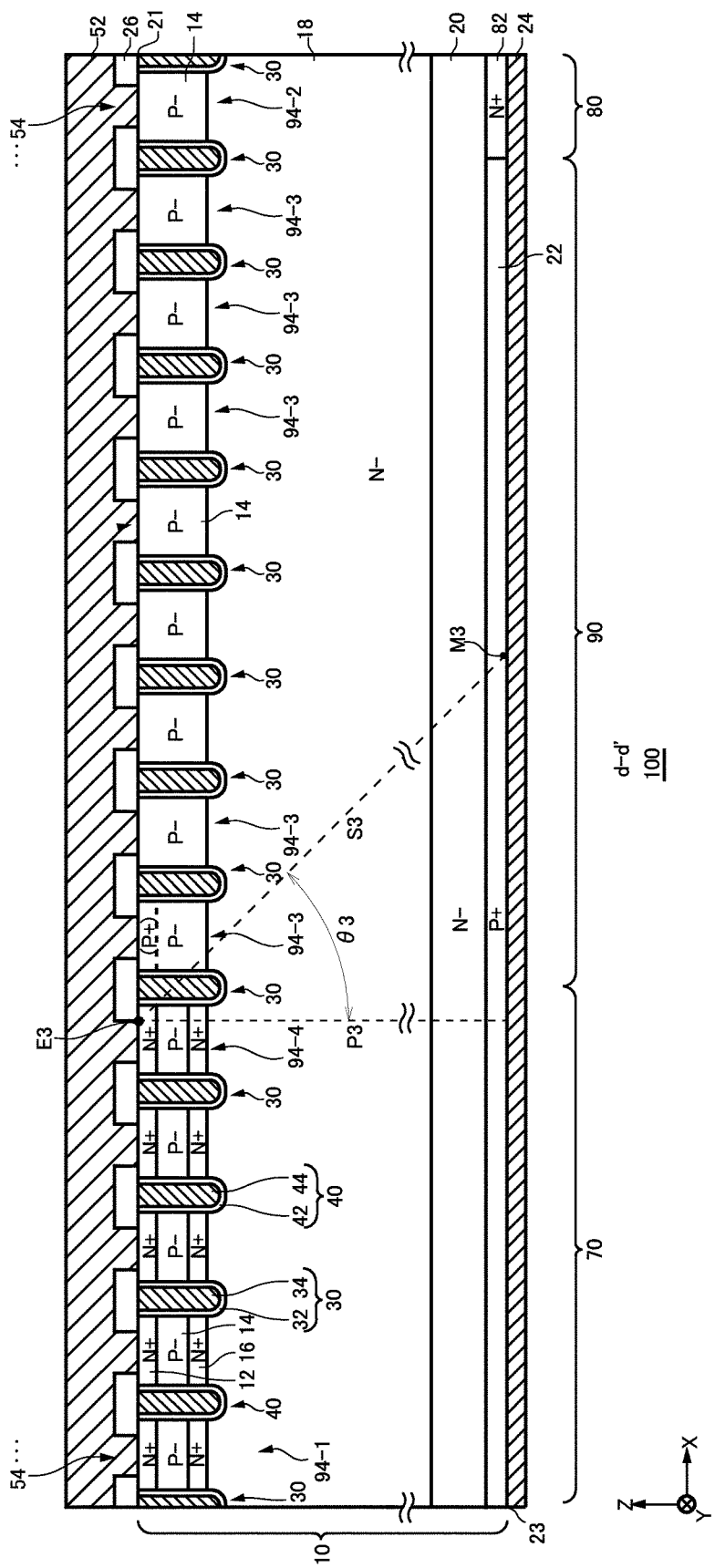
FIG. 4B is a diagram illustrating an example of a cross section d-d' of the semiconductor device 100 illustrated in FIG. 4A.

FIG. 4B is a diagram illustrating an example of a cross section d-d' of the semiconductor device 100 illustrated in FIG. 4A. The cross section d-d' is a cross section parallel to the X-Z plane and passing through the emitter region 12 of the transistor portion 70.

An end portion E3 is an end portion of the contact hole 54 in the arrangement direction for electrically connecting the emitter electrode 52 and the emitter region 12. The end portion E3 may be an end portion in the arrangement direction of the interlayer dielectric film 26 covering the dummy trench portion 30 provided between the transistor portion 70 and the boundary portion 90. The position of the end portion E3 in the depth direction corresponds to the front surface 21.

A third straight line S3 is a straight line that forms a predetermined angle θ3 with a third perpendicular line P3 from the end portion E3 toward the back surface 23 of the semiconductor substrate 10 in the arrangement direction and passes through the end portion E3. The angle θ3 may be 30° or more. The angle θ3 may be 60° or less. The angle θ3 may be 45°. The third perpendicular line P3 is a straight line passing through the end portion E3 and extending in the Z axis direction.

A position M3 is a position where the third straight line S3 intersects the back surface 23 of the semiconductor substrate 10. The position M3 is located on the outer side of the cathode region 82 in the arrangement direction. For example, when the angle θ3 is 45°, the cathode region 82 is provided farther from the end portion E3 than the thickness of the semiconductor substrate 10 in the Z axis direction in a plane parallel to the front surface 21. The contact region 15 having a doping concentration higher than that of the base region 14 is provided in the front surface 21 of the transistor portion 70. The contact region 15 may be provided in the entire surface of the front surface 21 in the boundary mesa portion 94-3 disposed closest to the transistor portion 70 side in the boundary portion 90. When the diode portion 80 is in the on state, holes are injected into the drift region 18 not only from the base region 14 but also from the contact region 15, and flow toward the cathode region 82. Therefore, the reverse recovery current may increase. Since the cathode region 82 is farther from the transistor portion 70 than the position M3, hole injection from the base region 14 disposed in the front surface 21 side of the cathode region 82 becomes dominant. As a result, the influence of the contact region 15 can be reduced, and the reverse recovery current can be reduced.

Figure 5A:
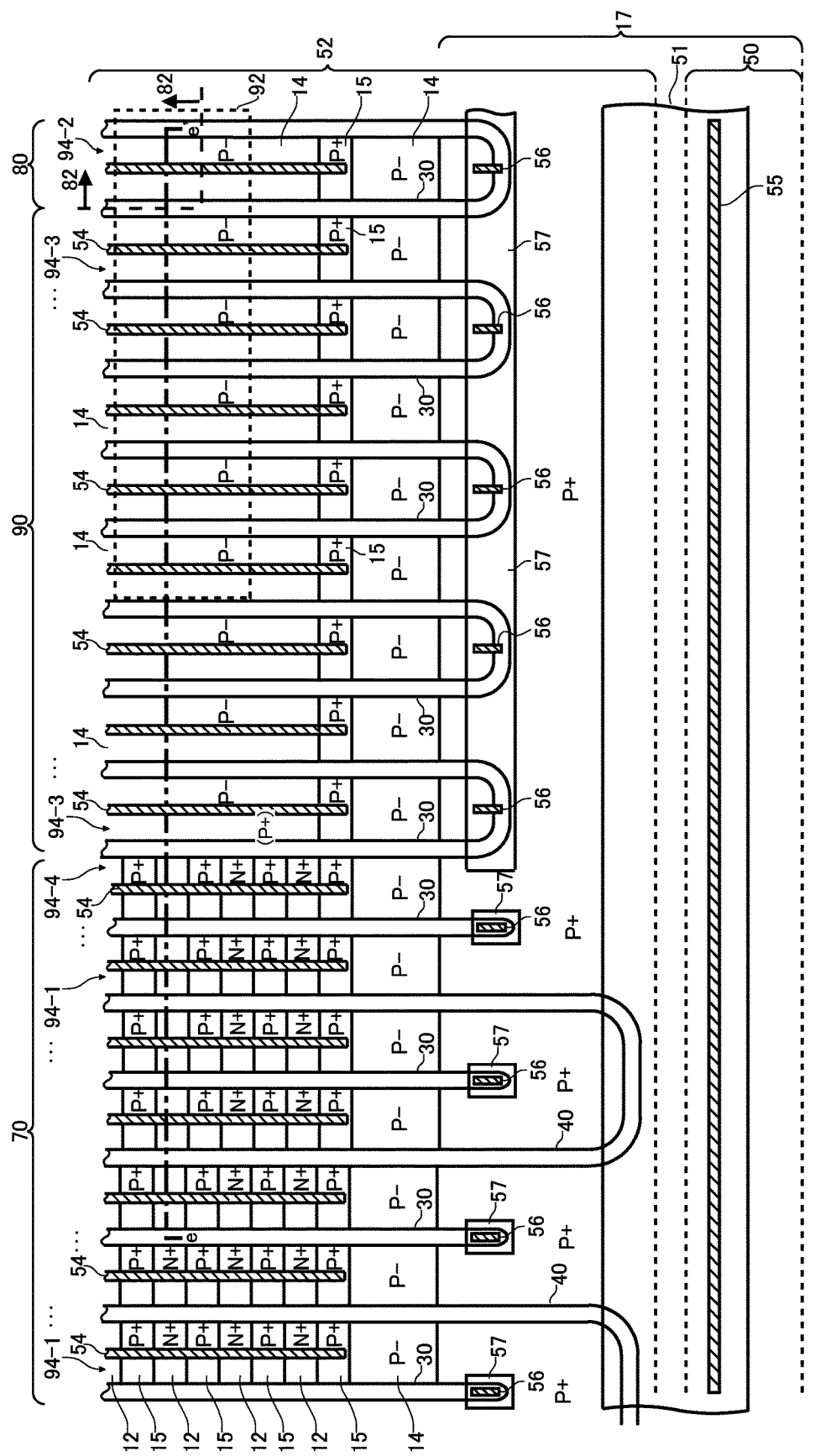
FIG. 5A is a top view illustrating an example of the region 130 of the semiconductor device 100 illustrated in FIG. 1.

FIG. 5A is a top view illustrating an example of the region 130 of semiconductor device 100 illustrated in FIG. 1. The present example is different from the case of FIG. 4A in that the front surface side lifetime reduction region 92 is included.

The front surface side lifetime reduction region 92 is provided to cover a region wider than the cathode region 82 of the diode portion 80 in a plane parallel to the front surface 21 of the semiconductor substrate 10. The front surface side lifetime reduction region 92 may be provided in a range wider than the cathode region 82 in both the X axis direction and the Y axis direction. As a result, the lifetime of the carrier injected from the outer side of the cathode region 82 can be appropriately controlled.

The mesa portion 94-4 of the present example is sandwiched between the dummy trench portions 30, and a channel is not formed in the ON operation of the transistor portion 70. Therefore, even when the irradiation position of helium ions or the like is shifted due to manufacturing variations or the like, it is possible to suppress fluctuation of the threshold voltage or the like in the transistor portion 70. The transistor portion 70 may have a plurality of mesa portions 94-4.

Figure 5B:
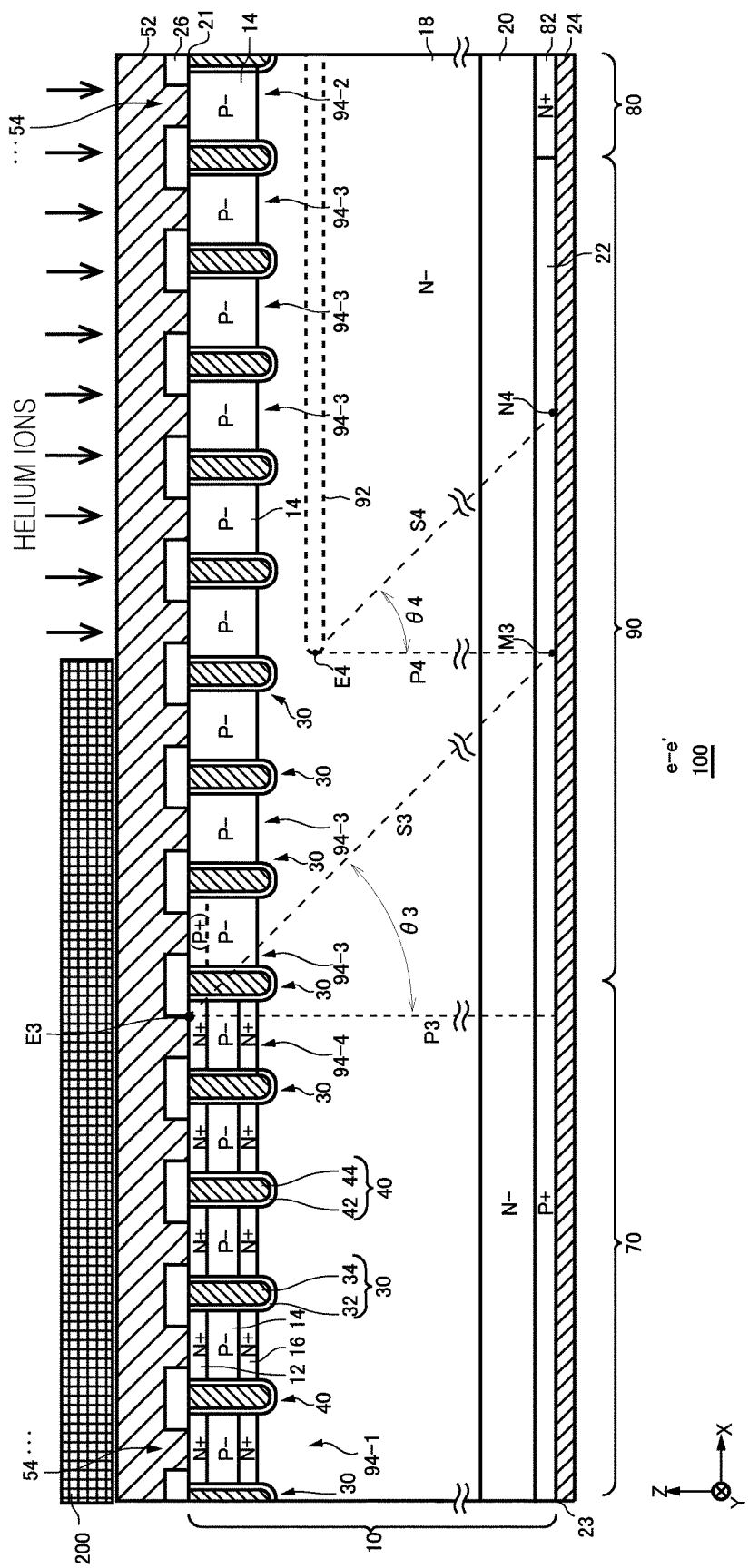
FIG. 5B is a diagram illustrating an example of a cross section e-e' of the semiconductor device 100 illustrated in FIG. 5A.

FIG. 5B is a diagram illustrating an example of a cross section e-e' of the semiconductor device 100 illustrated in FIG. 5A. The cross section e-e' is a cross section parallel to the X-Z plane and passing through the emitter region 12 of the transistor portion 70.

An end portion E4 is an end portion of the front surface side lifetime reduction region 92 in the arrangement direction. The position of the end portion E4 in the depth direction may be a peak position of the front surface side lifetime reduction region 92 in the depth direction of the semiconductor substrate 10. The end portion E4 is located close to the cathode region 82 with respect to the end portion E3 of the contact holes 54 in the arrangement direction. The end portion E4 is provided in the boundary portion 90. The end portion E4 is located on the outer side of the cathode region 82. That is, the front surface side lifetime reduction region 92 is provided extending to the outer side of the cathode region 82 in the arrangement direction.

The end portion E4 may be provided on the inner side of the diode portion 80 with respect to the third straight line S3 in the arrangement direction. The end portion E4 of the present example is provided between the position M3 and the end portion E3 in the arrangement direction. That is, the front surface side lifetime reduction region 92 extends to the outer side (that is, the negative side in the X axis direction) of the diode portion 80 with respect to the position M3. When the angle θ3 is 45°, the distance between the end portion E3 and the end portion E4 in the arrangement direction is smaller than the thickness $W_0$ of the semiconductor substrate 10 in the Z axis direction.

However, the end portion E4 may be provided between the position M3 and the cathode region 82 in the arrangement direction. In this case, the front surface side lifetime reduction region 92 does not extend to the position M3 and terminates on the inner side of the diode portion 80 (that is, the positive side in the X axis direction) with respect to the position M3. The front surface side lifetime reduction region 92 is not provided on the transistor portion 70 side from the end portion E4. Note that the relationship among the end portion E3, the third perpendicular line P3, the third straight line S3, and the position M3 is the same as that in the case of FIG. 4B.

A fourth straight line S4 is a straight line that forms a predetermined angle θ4 with a fourth perpendicular line P4 from the end portion E4 toward the back surface 23 of the semiconductor substrate 10 and passes through the end portion E4. For example, the angle θ4 may be 30° or more. The angle θ4 may be 60° or less. The angle θ4 may be 45°. The angle θ4 may be the same as or different from the angle θ3. The fourth perpendicular line P4 is a straight line passing through the end portion E4 and extending in the Z axis direction.

A position N4 is a position where the fourth straight line S4 intersects the back surface 23 of the semiconductor substrate 10 in the arrangement direction (X axis direction). The position N4 is located on the outer side of the cathode region 82 in the arrangement direction. The end portion E4 is located close to the cathode region 82 with respect to the end portion E3 of the contact holes 54 in the arrangement direction. In this way, the cathode region 82 of the present example is disposed further away from the transistor portion 70 with respect to the end portion E4 of the front surface side lifetime reduction region 92. As a result, the peak current at the time of the reverse recovery of the diode portion 80 can be suppressed, and the withstand capability of the semiconductor device 100 can be improved.

The position M3 in the present example is the same as the position of the end portion E4 in the arrangement direction. However, the front surface side lifetime reduction region 92 may be disposed such that the position M3 is provided close to the transistor portion 70 with respect to the end portion E4 in the arrangement direction. As a result, the distance between the transistor portion 70 and the front surface side lifetime reduction region 92 can be further increased, so that even when the irradiation position of helium ions or the like is shifted due to manufacturing variations or the like, fluctuation of the threshold voltage or the like in the transistor portion 70 can be suppressed.

The front surface side lifetime reduction region 92 is provided in the entire diode portion 80 and a partial region adjacent to the diode portion 80 in the boundary portion 90 in the cross section e-e'. The boundary portion 90 may have the front surface side lifetime reduction region 92 in at least one mesa portion 94 adjacent to the diode portion 80, and may not have the front surface side lifetime reduction region 92 in at least one mesa portion 94 adjacent to the transistor portion 70. The front surface side lifetime reduction region 92 may terminate below any of the trench portions or may terminate below any of the mesa portions 94.

By providing the boundary portion 90, the distance between the N+ type cathode region 82 and the transistor portion 70 can be increased. By forming the front surface side lifetime reduction region 92 in a part of the boundary portion 90, the lifetime of the holes injected from the transistor portion 70 into the diode portion 80 can be appropriately controlled, and the loss at the time of the reverse recovery can be reduced.

Since the front surface side lifetime reduction region 92 is formed over the entire diode portion 80 and a part of the boundary portion 90, the front surface side lifetime reduction region is formed over a region wider than the cathode region 82 in the arrangement direction. The front surface side lifetime reduction region 92 may be formed over a half or more of the boundary portion 90 in the arrangement direction.

Alternatively, the length in the arrangement direction of the region where the front surface side lifetime reduction region 92 is formed at the boundary portion 90 may be longer than the length in the arrangement direction of the region where the front surface side lifetime reduction region 92 is not formed at the boundary portion 90. For example, the front surface side lifetime reduction region 92 may be formed in a region other than one mesa portion 94 adjacent to the transistor portion 70 in the boundary portion 90. As a result, the lifetime of the holes injected from the transistor portion 70 into the diode portion 80 can be easily controlled.

A mask 200 is used in a process of forming the front surface side lifetime reduction region 92. In the present example, helium ions are irradiated from the front surface 21 side of the semiconductor substrate 10 using the mask 200 to form the front surface side lifetime reduction region 92. The mask 200 may be formed by applying a resist or the like and patterning the resist or the like into a predetermined shape. The front surface side lifetime reduction region 92 is not formed in the region covered with the mask 200.

The mask 200 formed by applying a resist or the like may be formed so as to be in contact with a structure formed on the front surface 21 of the semiconductor substrate 10. In the present example, the structure formed on the front surface 21 of the semiconductor substrate 10 is the emitter electrode 52. A hard mask formed of a material such as metal or silicon needs to be formed away from the emitter electrode 52 by a predetermined distance on the outer side (+Z axis direction) with respect to the front surface 21 so as not to cause scratches, defects, or the like on a structure such as an electrode, a protective film, or an interlayer dielectric film formed in the front surface 21 of the semiconductor substrate 10. Therefore, fine alignment with a surface structure provided inside the front surface 21 side or on the outer side of the front surface 21 of the semiconductor substrate 10 becomes difficult. As in the present example, by forming the mask 200 so as to be in contact with the structure formed on the front surface 21 of the semiconductor substrate 10, extremely fine alignment with an surface structure becomes easy.

The front surface side lifetime reduction region 92 may be formed before the emitter electrode 52. The front surface side lifetime reduction region 92 of the present example is formed after each trench portion, the base region 14, the accumulation region 16, and the emitter region 12 are formed.

In the present example, since helium ions are irradiated from the front surface 21 side of the semiconductor substrate 10, the depth position of the front surface side lifetime reduction region 92 can be controlled with high accuracy as compared with the case where helium ions are irradiated from the back surface side. In addition, since the transistor portion 70 is covered with the mask 200, damage to the gate trench portion 40 due to irradiation of helium ions can be prevented. Since helium ions are irradiated to a shallow position, a hard mask may not be used. Therefore, the cost can be reduced. Note that the front surface side lifetime reduction region 92 may be formed by irradiating helium ions from the back surface 23 of the semiconductor substrate 10.

Figure 6A:
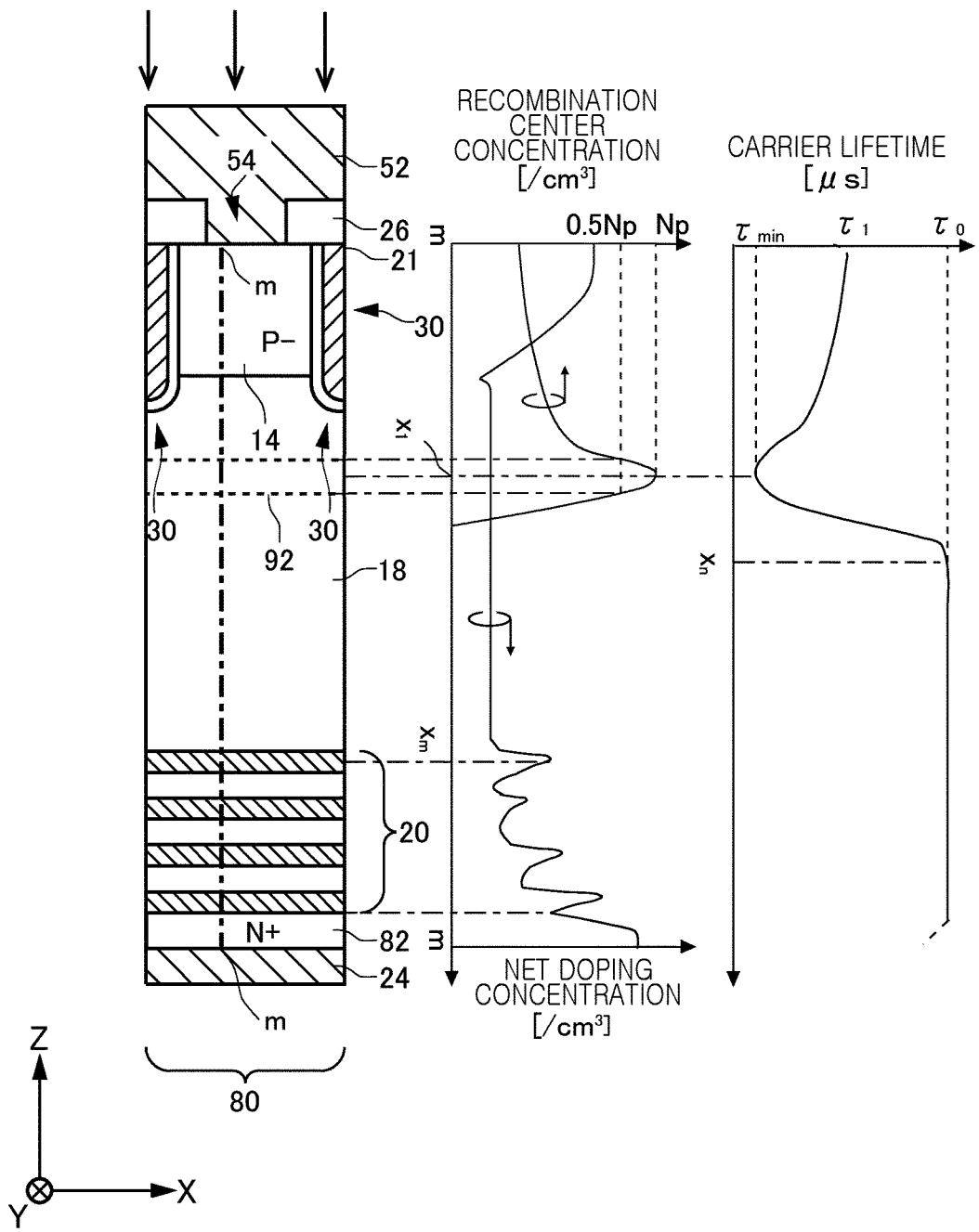
FIG. 6A is a diagram for explaining the concentration distribution of a semiconductor substrate 10 having a front surface side lifetime reduction region 92.

FIG. 6A is a diagram for explaining a concentration distribution of the semiconductor substrate 10 having the front surface side lifetime reduction region 92. The front surface side lifetime reduction region 92 of the present example is formed by irradiating helium ions from the front surface 21 side of the semiconductor substrate 10. Hydrogen ions may be implanted instead of helium ions. The cross section m-m is an arbitrary cross section of the diode portion 80 provided with the front surface side lifetime reduction region 92. In the present example, the concentration distribution, the net doping concentration distribution, and the carrier lifetime distribution of the recombination center in the Z axis direction in the front surface side lifetime reduction region 92 in the cross section m-m are illustrated.

The concentration of the lifetime killer (recombination center) in the front surface side lifetime reduction region 92 becomes a peak concentration Np at a predetermined depth position. The depth position is disposed in the drift region 18 on the front surface 21 side with respect to the center of the semiconductor substrate 10 in the depth direction. A region having a lifetime killer with a concentration higher than the half value 0.5 Np of the peak concentration Np may be set as the region of the front surface side lifetime reduction region 92.

When helium ions or the like are irradiated from the front surface 21 side, the lifetime killer having a concentration lower than the peak concentration Np is distributed so as to tail from the peak position to the front surface 21 of the semiconductor substrate 10. On the other hand, the concentration of the lifetime killer on the back surface 23 side of the semiconductor substrate 10 with respect to the peak position decreases more steeply than the concentration of the lifetime killer on the front surface 21 side of the semiconductor substrate 10 with respect to the peak position. The concentration distribution of the front surface side lifetime reduction region 92 may not reach the back surface 23.

The depth position of the peak concentration Np may be close to the back surface 23 side with respect to the intermediate position of the semiconductor substrate 10 in the depth direction as long as the distribution continuously draws the tail from the front surface 21 to the position of the peak concentration Np.

Note that the concentration distribution of recombination centers illustrated in FIG. 6A may be the helium concentration as described above, may be hydrogen ions, or may be crystal defect density formed by irradiation of helium or implantation of hydrogen ions. The crystal defect may be a dangling bond formed by interstitial helium, interstitial hydrogen, vacancies, double vacancies or the like, vacancies or the like. These crystal defects form the recombination center of the carrier. The recombination of the carrier is promoted via an energy level (trap level) of the formed recombination center. The recombination center concentration corresponds to a trap level density.

In the buffer region 20, a plurality of regions (four regions in the present example) indicated by hatching is a region including a position corresponding to the peak concentration of the doping concentration distribution of the buffer region 20. As an example, the width in the depth direction of each of the plurality of regions indicated by hatching may correspond to the full width at half maximum of the peak doping concentration with the peak position as the center.

A peak position $x_j$ of the recombination center concentration of the front surface side lifetime reduction region 92 may be separated to the front surface 21 side from a peak position $x_m$ located closest to the front surface 21 side among the plurality of peak positions of the buffer region 20. When the buffer region 20 contains a hydrogen donor, hydrogen may terminate vacancies and dangling bonds at the peak position illustrating the local maximum value of the hydrogen donor concentration, and the recombination center concentration may decrease. Therefore, the peak position of the recombination center concentration in the front surface side lifetime reduction region 92 may be separated from the peak position of the buffer region 20 to reduce the influence of termination by hydrogen. Further, the peak position of the recombination center concentration of the front surface side lifetime reduction region 92 may be formed between a plurality of peak positions of the buffer region 20. This also has an effect of reducing the influence of termination by hydrogen.

The carrier lifetime distribution illustrated in FIG. 6A has a minimum value $T_{min}$ at a position substantially corresponding to the peak concentration position of the recombination center concentration. In the base region 14 close to the front surface 21, the carrier lifetime distribution may have a value $\tau_1$ larger than $\tau_{min}$. In another region in the depth direction in which the lifetime killer is not introduced, the carrier lifetime distribution may be distributed with a substantially uniform value (referred to as $\tau_0$) in a region deeper than the peak concentration position of the recombination center concentration. In the buffer region 20, the carrier lifetime may be distributed at a value of about $\tau_0$ due to a termination effect of vacancies and dangling bonds by hydrogen. A position $x_n$ at which the carrier lifetime decreases from $\tau_0$ may be located close to the front surface 21 side with respect to the peak position $x_m$ located closest to the front surface 21 side among the plurality of peak concentrations of the buffer region 20. Note that the carrier lifetime near the front surface 21 and the back surface 23 may be smaller than $\tau_0$ because the doping concentration is high.

Figure 6B:
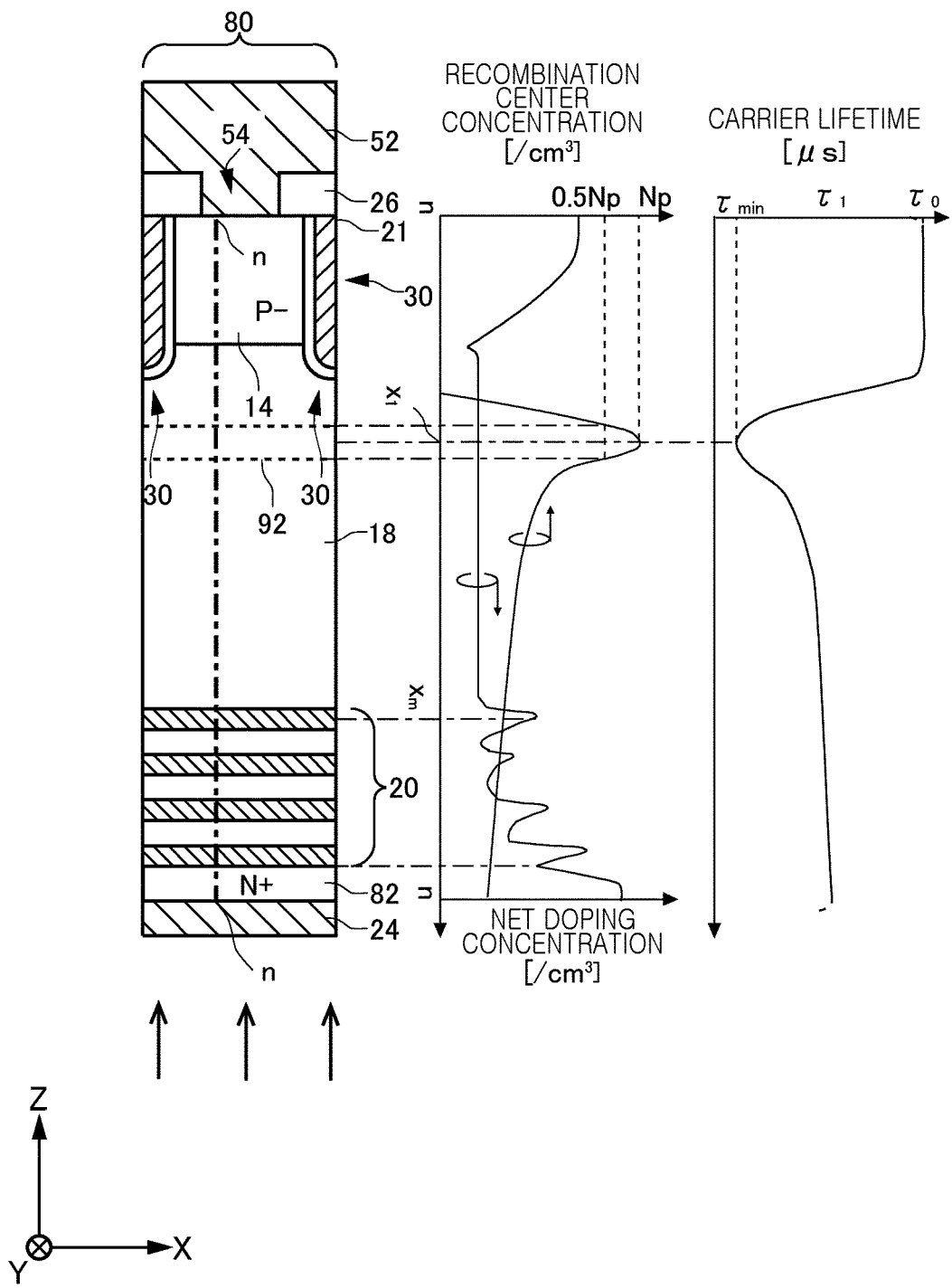
FIG. 6B is a diagram for explaining the concentration distribution of the semiconductor substrate 10 having the front surface side lifetime reduction region 92.

FIG. 6B is a diagram for explaining the concentration distribution of the semiconductor substrate 10 having the front surface side lifetime reduction region 92. The front surface side lifetime reduction region 92 of the present example is formed by irradiating helium ions from the back surface 23 side of the semiconductor substrate 10. Hydrogen ions may be implanted instead of helium ions. The cross section n-n is an arbitrary cross section of the diode portion 80 provided with the front surface side lifetime reduction region 92. In the present example, the concentration distribution, the net doping concentration distribution, and the carrier lifetime distribution of the recombination center in the Z axis direction in the front surface side lifetime reduction region 92 in the cross section n-n are illustrated.

Similarly to the case where helium ions or the like are irradiated from the front surface 21 side, the peak concentration Np is obtained in the drift region 18 on the front surface 21 side with respect to the center of the semiconductor substrate 10 in the depth direction.

When helium ions or the like are irradiated from the back surface 23 side, the lifetime killer having a concentration lower than the peak concentration Np is distributed so as to tail from the peak position to the back surface 23 of the semiconductor substrate 10. On the other hand, the concentration of the lifetime killer on the front surface 21 side of the semiconductor substrate 10 with respect to the peak position decreases more steeply than the concentration of the lifetime killer on the back surface 23 side of the semiconductor substrate 10 with respect to the peak position. The concentration distribution of the front surface side lifetime reduction region 92 may not reach the front surface 21.

The carrier lifetime distribution illustrated in FIG. 6B has a minimum value $\tau_{min}$ at a position substantially corresponding to the peak concentration position of the recombination center concentration. In the region close to the back surface 23, the carrier lifetime distribution may have a value $\tau_1$ larger than $\tau_{min}$. In another region in the depth direction in which the lifetime killer is not introduced, the carrier lifetime distribution may be distributed with a substantially uniform value (referred to as $\tau_0$) in a region deeper than the peak concentration position of the recombination center concentration.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The execution order of each processing such as the operation, procedure, step, and stage in the methods illustrated in the claims, the specification, and the drawings does not mean that the processing is necessarily performed in this order even if it is described using "First", "Next", and the like for convenience.

EXPLANATION OF REFERENCES

10: semiconductor substrate
12: emitter region
14: base region
15: contact region
16: accumulation region
17: well region
18: drift region
20: buffer region
21: front surface
22: collector region
23: back surface
24: collector electrode
26: interlayer dielectric film
30: dummy trench portion
32: dummy dielectric film
34: dummy conductive portion
40: gate trench portion
42: gate dielectric film
44: gate conductive portion
50: gate metal layer
51: gate runner portion
52: emitter electrode
54: contact hole
55: contact hole
56: contact hole
57: connection portion
59: dielectric film
70: transistor portion
80: diode portion
82: cathode region
90: boundary portion
92: front surface side lifetime reduction region
94: mesa portion
100: semiconductor device
116: gate pad
120: active portion
130: region
140: outer peripheral end
150: edge termination structure portion
200: mask

What is claimed is:

1. A semiconductor device comprising:
a transistor portion provided in a semiconductor substrate, having an emitter region of a first conductivity type on a front surface side of the semiconductor substrate, and having a collector region of a second conductivity type on a back surface side of the semiconductor substrate;
a diode portion provided in the semiconductor substrate, and having a cathode region of a first conductivity type on a back surface side of the semiconductor substrate;
a plurality of trench portions provided extending in a predetermined extending direction in a plane parallel to a front surface of the semiconductor substrate; and
an emitter electrode provided above the semiconductor substrate, and electrically connected to a front surface of the semiconductor substrate, wherein
a straight line extending from an end portion E1 in the extending direction of a contact hole for electrically connecting the emitter electrode and a front surface of the semiconductor substrate toward a back surface of the semiconductor substrate is defined as a first perpendicular line,
a straight line forming a predetermined angle θ1 with respect to the first perpendicular line and passing through the end portion E1 in the extending direction of the contact hole is defined as a first straight line,
a position where the first straight line intersects a back surface of the semiconductor substrate is defined as a position M1,
the position M1 is located on an outer side of the cathode region in the extending direction, and
the angle θ1 is 20° or more and 80° or less.

2. The semiconductor device according to claim 1, wherein
the angle θ1 is 30° or more and 60° or less.

3. The semiconductor device according to claim 1, wherein
a front surface side lifetime reduction region is provided on a front surface side of the semiconductor substrate, and
an end portion E2 in the extending direction of the front surface side lifetime reduction region is located close to the cathode region side with respect to the end portion E1 in the extending direction of the contact hole.

4. The semiconductor device according to claim 3, wherein
the end portion E2 in the extending direction of the front surface side lifetime reduction region is located on an outer side of the cathode region.

5. The semiconductor device according to claim 3, wherein
the end portion E2 in the extending direction of the front surface side lifetime reduction region is located close to the cathode region side with respect to the first straight line.

6. The semiconductor device according to claim 3, wherein
the end portion E2 in the extending direction of the front surface side lifetime reduction region is provided, in the extending direction, between the position M1 and the end portion E1 in the extending direction of the contact hole.

7. The semiconductor device according to claim 3, wherein
a straight line extending from the end portion E2 in the extending direction of the front surface side lifetime reduction region toward a back surface of the semiconductor substrate is defined as a second perpendicular line,
a straight line forming a predetermined angle θ2 with respect to the second perpendicular line and passing through the end portion E2 in the extending direction of the front surface side lifetime reduction region is defined as a second straight line,
a position where the second straight line intersects a back surface of the semiconductor substrate is defined as a position N2,
the position N2 is located on an outer side of the cathode region in the extending direction, and
the angle θ2 is 20° or more and 80° or less.

8. The semiconductor device according to claim 3, wherein
the end portion E2 in the extending direction of the front surface side lifetime reduction region is provided between the position M1 and the cathode region.

9. The semiconductor device according to claim 1, wherein
the transistor portion includes one or more gate trench portions which are provided from a front surface of the semiconductor substrate to a position deeper than the emitter region and to which a gate potential is applied.

10. The semiconductor device according to claim 1, wherein
the transistor portion includes one or more dummy trench portions which are provided from a front surface of the semiconductor substrate to a position deeper than the emitter region and to which a potential different from a gate potential is applied.

11. The semiconductor device according to claim 1, wherein
the diode portion includes one or more dummy trench portions which are provided from a front surface of the semiconductor substrate to a position deeper than the emitter region and to which a potential different from a gate potential is applied.

12. The semiconductor device according to claim 1, comprising:
a boundary portion provided between the transistor portion and the diode portion in the semiconductor substrate, having no emitter region on a front surface side of the semiconductor substrate, and having the collector region on a back surface side of the semiconductor substrate.

13. The semiconductor device according to claim 12, wherein
the boundary portion includes one or more dummy trench portions which are provided from a front surface of the semiconductor substrate to a position deeper than the emitter region and to which a potential different from a gate potential is applied.

14. The semiconductor device according to claim 12, wherein
a mesa portion of the transistor portion is sandwiched between dummy trench portions, the mesa portion including the emitter region and being closest to the boundary portion.

15. The semiconductor device according to claim 1, comprising:
an interlayer dielectric film provided between a front surface of the semiconductor substrate and the emitter electrode, wherein
the interlayer dielectric film is provided with a contact hole opened to electrically connect a front surface of the semiconductor substrate and the emitter electrode.

16. The semiconductor device according to claim 1, wherein
the angle θ1 is 45° or less.

17. The semiconductor device according to claim 1, wherein
an extending direction of the plurality of trench portions in the transistor portion is equal to an extending direction of the plurality of trench portions in the diode portion in a front surface of the semiconductor substrate.

18. A semiconductor device comprising:
a transistor portion provided in a semiconductor substrate, having an emitter region of a first conductivity type on a front surface side of the semiconductor substrate, and having a collector region of a second conductivity type on a back surface side of the semiconductor substrate;
a diode portion provided in the semiconductor substrate, and having a cathode region of a first conductivity type on a back surface side of the semiconductor substrate;
a plurality of trench portions provided to be arranged in a predetermined arrangement direction in a plane parallel to a front surface of the semiconductor substrate; and
an emitter electrode provided above the semiconductor substrate, and electrically connected to a front surface of the semiconductor substrate, wherein
a straight line extending from an end portion E3 in the arrangement direction of a contact hole for electrically connecting the emitter electrode and the emitter region toward a back surface of the semiconductor substrate is defined as a third perpendicular line,
a straight line forming a predetermined angle θ3 with respect to the third perpendicular line and passing through the end portion E3 in the arrangement direction of the contact hole is defined as a third straight line,
a position where the third straight line intersects a back surface of the semiconductor substrate is defined as a position M3,
the position M3 is located on an outer side of the cathode region in the arrangement direction, and
the angle θ3 is 20° or more and 80° or less.

19. The semiconductor device according to claim 18, wherein
the angle θ3 is 30° or more and 60° or less.

20. The semiconductor device according to claim 18, wherein
a front surface side lifetime reduction region is provided on a front surface side of the semiconductor substrate, and
an end portion E4 in the arrangement direction of the front surface side lifetime reduction region is located close to the cathode region side with respect to the end portion E3 in the arrangement direction of the contact hole.

21. The semiconductor device according to claim 20, wherein
the end portion E4 in the arrangement direction of the front surface side lifetime reduction region is located on an outer side of the cathode region.

22. The semiconductor device according to claim 20, wherein
the end portion E4 in the arrangement direction of the front surface side lifetime reduction region is located close to the cathode region side with respect to the third straight line.

23. The semiconductor device according to claim 20, wherein
a straight line extending from the end portion E4 in the arrangement direction of the front surface side lifetime reduction region toward a back surface of the semiconductor substrate is defined as a fourth perpendicular line,
a straight line forming a predetermined angle θ4 with respect to the fourth perpendicular line and passing through the end portion E4 in the arrangement direction of the front surface side lifetime reduction region is defined as a fourth straight line,
a position where the fourth straight line intersects a back surface of the semiconductor substrate is defined as a position N4,
the position N4 is located on an outer side of the cathode region in the arrangement direction, and
the angle θ4 is 20° or more and 80° or less.

24. The semiconductor device according to claim 20, wherein
the end portion E4 in the arrangement direction of the front surface side lifetime reduction region is provided between the position M3 and the cathode region.

25. The semiconductor device according to claim 20, wherein
the position M3 is provided close to the transistor portion with respect to the end portion E4 of the front surface side lifetime reduction region in the arrangement direction.

* * * * *